United States Patent
Uppili et al.

(10) Patent No.: US 11,823,905 B2
(45) Date of Patent: Nov. 21, 2023

(54) SELF ALIGNED MOSFET DEVICES AND ASSOCIATED FABRICATION METHODS

(71) Applicant: SCDevice LLC, Portland, OR (US)

(72) Inventors: Sudarsan Uppili, Portland, OR (US); David Lee Snyder, Beaverton, OR (US); Scott Joseph Alberhasky, Hillsboro, OR (US)

(73) Assignee: SCDevice LLC, Portland, OR (US)

( * ) Notice: Subject to any disclaimer, the term of this patent is extended or adjusted under 35 U.S.C. 154(b) by 124 days.

(21) Appl. No.: 17/682,207

(22) Filed: Feb. 28, 2022

(65) Prior Publication Data
US 2023/0274937 A1 Aug. 31, 2023

(51) Int. Cl.
*H01L 21/04* (2006.01)
*H01L 21/76* (2006.01)
(Continued)

(52) U.S. Cl.
CPC ........ *H01L 21/0465* (2013.01); *H01L 21/761* (2013.01); *H01L 21/7602* (2013.01); *H01L 29/063* (2013.01); *H01L 29/1095* (2013.01); *H01L 29/167* (2013.01); *H01L 29/1608* (2013.01); *H01L 29/66068* (2013.01); *H01L 29/7802* (2013.01)

(58) Field of Classification Search
CPC ............. H01L 21/0465; H01L 21/7602; H01L 21/761; H01L 29/063; H01L 29/1095; H01L 29/1608; H01L 29/167; H01L 29/66068; H01L 29/7802
USPC .......................................................... 257/77
See application file for complete search history.

(56) References Cited

U.S. PATENT DOCUMENTS 6,121,089 A * 9/2000 Zeng .................... H01L 29/7813
257/E29.066
8,053,298 B2 11/2011 Bhalla
(Continued)

FOREIGN PATENT DOCUMENTS

JP 2001094097 A 4/2001

OTHER PUBLICATIONS

D. Kim, et al., "An Inclusive Structural Analysis on the Design of 1.2kV 4H-SiC Planar MOSFETs", Journal of the Electron Devices Society, Sep. 15, 2021, 9 pages.

(Continued)

*Primary Examiner* — Igwe U Anya
(74) *Attorney, Agent, or Firm* — Daylight Law, P.C.

(57) ABSTRACT

Self-aligned FET devices and associated fabrication methods are disclosed herein. A disclosed process for forming a FET includes forming a first mask, implanting a deep well region in a drift region using the first mask, forming a spacer in contact with the first mask, and implanting a shallow well region in the drift region using the first mask and the spacer. A disclosed FET includes a drift region, a shallow well region, a deep well region located between the shallow well region and the drift region, and a junction field effect region: in contact with the shallow well region, the drift region, and the deep well region; and having a junction field effect doping concentration of the first conductivity type. The FETs can include a hybrid channel formed by a portion of the junction field effect region, as influenced by the deep well region, and the shallow well region.

16 Claims, 16 Drawing Sheets

(51) Int. Cl.
  *H01L 21/761* (2006.01)
  *H01L 29/06* (2006.01)
  *H01L 29/10* (2006.01)
  *H01L 29/16* (2006.01)
  *H01L 29/167* (2006.01)
  *H01L 29/66* (2006.01)
  *H01L 29/78* (2006.01)

(56) References Cited

U.S. PATENT DOCUMENTS

| | | | |
|---|---|---|---|
| 10,355,132 B2 | 7/2019 | Baliga | |
| 10,504,995 B1* | 12/2019 | Domeij | H01L 29/66068 |
| 2016/0233210 A1* | 8/2016 | Matocha | H01L 21/046 |
| 2017/0207305 A1* | 7/2017 | Yen | H01L 21/047 |
| 2021/0134989 A1 | 5/2021 | Rahimo et al. | |

OTHER PUBLICATIONS

H. Jiang, et al., "Silicon Carbide Split-Gate MOSFET with Merged Schottky Barrier Diode and Reduced Switching Loss", Proceedings of the 2016 28th International Symposium on Power Semiconductor Devices and ICs (ISPSD), Jun. 12-16, 2016, Prague, Czech Republic, 4 pages.

K. Han, et al., "Split-Gate 1.2 kV 4H-SiC MOSFET: Analysis and Experimental Validation", DOI 10.1109/LED.2017.2738616, IEEE Electron Device Letters, 4 pages.

W. Sung, et al., "A comparative study of channel designs for SiC MOSFETs: accumulation mode channel vs. inversion mode channel", SiC-P9, Proceedings of The 29th International Symposium on Power Semiconductor Devices & ICs, Sapporo, 4 Pages.

International Search Report and Written Opinion dated Jun. 29, 2023 from PCT Application No. PCT/US23/12559, 14 pages.

* cited by examiner

300

1000

SELF ALIGNED MOSFET DEVICES AND ASSOCIATED FABRICATION METHODS

BACKGROUND

A normally-off field effect transistor (FET) operates through the controlled creation of an inversion layer in a channel region of the FET. The inversion layer is caused by the application of a control voltage to a gate of the FET. The inversion layer is used to create a conductive path through the channel region between a source terminal of the FET and a drain terminal of the FET. FETs can be used in high power applications and operate in circuits such as DC-DC converters, switched mode power supplies, and various other applications. High power applications require transistors to be able to withstand a large voltage across the source and drain terminals of the device while the device is off and conduct a large current from the source terminal to the drain terminal while the device is on. A challenge facing FET device designers is how to maximize both these values as most design options cause a tradeoff between them (i.e., a device that can conduct a larger current will generally have a lower maximum voltage it can withstand).

SUMMARY

Self-aligned FET devices and associated fabrication methods are disclosed herein. In specific embodiments of the invention, a first mask is used to create a deep well region for a FET, a spacer is formed in contact with the first mask, and the spacer and first mask are used to create a shallow well region for the FET. The resulting structure includes a notch which will shield the gate oxide at the interface of the shallow well region from high electric field. In specific embodiments of the invention, the first mask and the spacer are used to create a second mask, and the second mask is used to create a junction field effect region for the FET.

In specific embodiments of the invention, a junction field effect region, created in the manner described above, is in contact with the shallow well region, a drift region, and the deep well region, and exhibits certain benefits such as being able to exhibit various doping profiles tailored for specific application. Furthermore, in these approaches, junction field implant does not interact with shallow well implant since it is formed in a self-aligned manner with respect to shallow well implant. As a result, the shallow well region and junction field effect region can be independently optimized for device performance without the concern on implant compensation effects.

In specific embodiments of the invention, a second spacer is formed in contact with the first spacer, and the second spacer, first spacer, and first mask are used to create a source contact region for the FET.

In specific embodiments of the invention, a shallow well region and a portion of the junction field effect region can form a hybrid channel for the FET. Such a device can be formed in various ways. However, using the approach described in the prior paragraph can provide precise control over the length of the channel of the FET which is an important metric for providing control of the characteristics of the FET in general. The portion of the junction field effect region can be located above the deep well region and can be fully depleted by the deep well region when the FET is off. The hybrid channel is therefore formed by an accumulation mode channel comprising the portion of the junction field effect region and an inversion mode channel comprising the shallow well region. Such hybrid channel devices can exhibit significant benefits as described in the detail description below.

Certain self-aligned MOSFET devices and associated fabrication methods disclosed herein can relate to either split gate or single gate structures. In specific embodiments of the invention, the self-aligned MOSFET device is a split gate device. In these embodiments, the process which splits the gate material can be aligned to the deep well of the FET device and can result in a device in which the gate is entirely shielded from the drain electrode of the FET by the deep well region. As such, the device can have strong radiation tolerance and an improved performance metric in terms of the electric field across the gate oxide in the junction field effect region. In these embodiments, the process which splits that gate material can be aligned to the deep well of the FET device and can result in a device in which the gate can adequately control the hybrid channel mentioned in the prior paragraph. While these approaches are alternatives, they are both related to alignment of the gate formation to the deep well region of the device.

In specific embodiments of the invention, a process for forming a FET is provided. The process includes forming a first mask, implanting a deep well region in a drift region using the first mask, forming a spacer in contact with the first mask, and implanting a shallow well region in the drift region using the first mask and the spacer.

In specific embodiments of the invention, another process for forming a FET is provided which can be used in combination with or in the alternative to the process described in the prior paragraph. The process includes forming a first mask, implanting a deep well region on a substrate using the first mask, forming a spacer in contact with the first mask, and implanting a shallow well region on the substrate using the first mask and the spacer. The spacer has a width, measured across a surface of the substrate, of greater than 0.2 microns and less than 1.0 micron.

In specific embodiments of the invention, a FET is provided. The FET includes a drift region of a first conductivity type, a shallow well region of a second conductivity type, a deep well region of the second conductivity type and located between the shallow well region and the drift region, and a junction field effect region: (i) in contact with the shallow well region, the drift region, and the deep well region; and (ii) having a junction field effect doping concentration of the first conductivity type. The deep well region is located below the shallow well region. A portion of the junction field effect region is located above the deep well region. The portion of the junction field effect region is fully depleted by the deep well region when the junction field effect transistor is off.

DETAILED DESCRIPTION

Figure 1A:
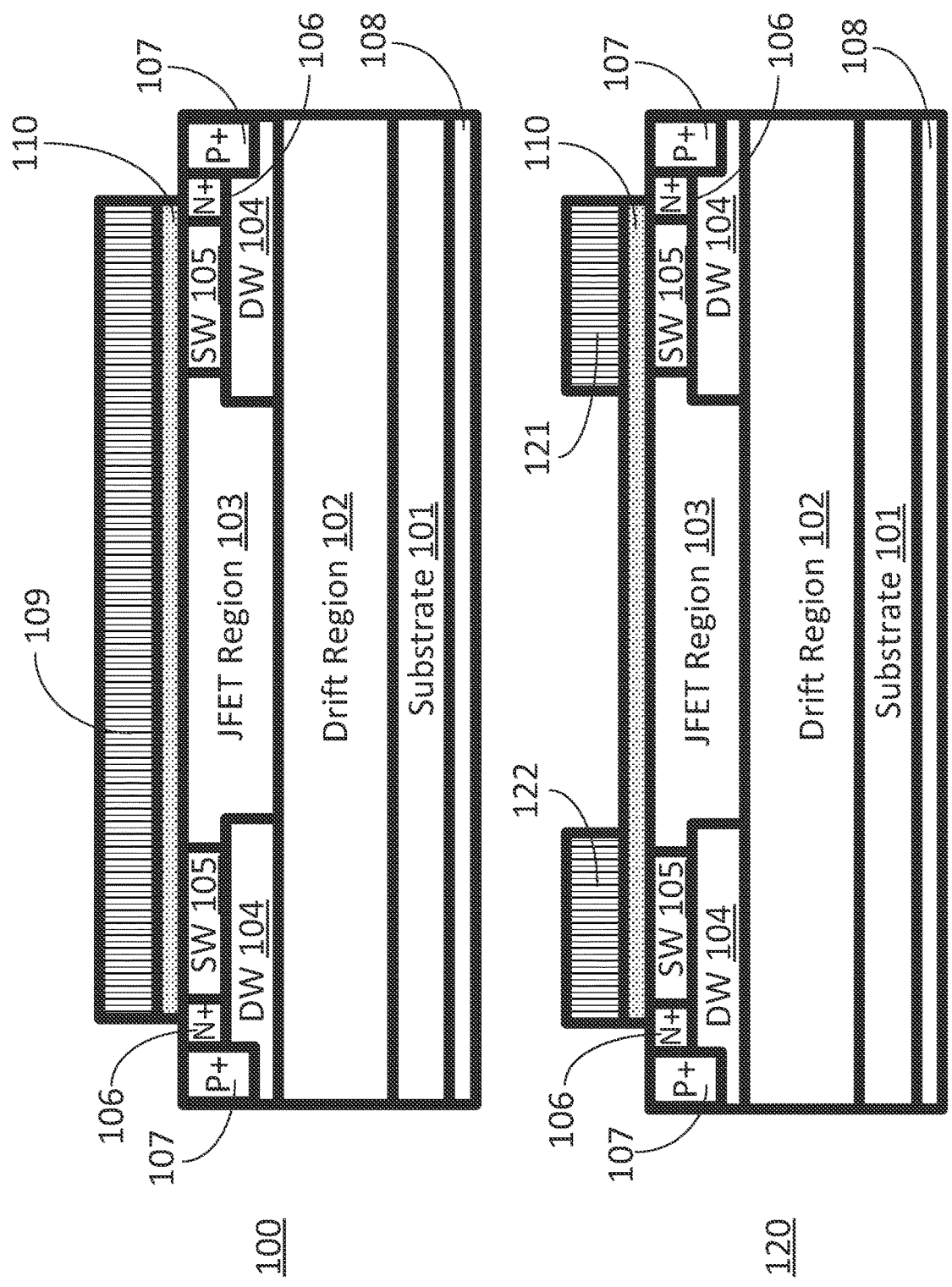
FIG. 1A illustrates two cross sections taken from different types of vertical FET devices in accordance with specific embodiments of the invention disclosed herein.

Methods and systems related to the field of semiconductor transistors in accordance with the summary above are disclosed in detail herein. The methods and systems disclosed in this section are nonlimiting embodiments of the invention, are provided for explanatory purposes only, and should not be used to constrict the full scope of the invention disclosed herein.

FET devices are disclosed herein that can operate in high voltage and high-power applications. These devices can operate with an off-voltage range of 300 to 3,300 volts and with on currents in the range of 1 to 40 amperes. The devices can operate in temperature ranges of −55° to +150° Celsius. The devices can be used with Schottky diodes, insulated gate bipolar junction transistors (IGBTs), and other passive components integrated on the same substrate or distributed across separate substrates. The devices can be formed on silicon carbide substrates, silicon substrates, or substrates of various other types of semiconductor material. The devices can be used in DC-DC converters, switched mode power supplies, and various other kinds of circuits and applications.

FET devices are disclosed herein that are radiation tolerant. Such devices can operate in space electronic power conditions and high-altitude conditions. In certain space applications, the use of silicon carbide devices can increase payload integration and free up space for alternative components. In specific embodiments of the invention in which the devices are formed in silicon carbide, the circuits can function at ambient temperatures of up to 500° Celsius. The devices can be used as satellite power components and solar array high-voltage blocking devices. The devices can exhibit a resistance to single event burnout with hold off voltages up to and exceeding 1,200 volts. In specific embodiments of the invention disclosed herein, radiation tolerant silicon carbide FET devices can exhibit useful performance for high power applications while experiencing a radiation bombardment with a linear energy transfer (LET) of up to 90 MeV/(mg/cm$^2$). As used herein, the term "linear energy transfer" is used to indicate the average amount of energy that is lost per unit path-length as a charged particle travels through a given material.

FIG. 1 illustrates two cross sections taken from different types of vertical FET devices in accordance with specific embodiments of the invention disclosed herein. Cross section 100 illustrates a single gate device. Cross section 120 illustrates a split gate device. Both types of devices are presented because specific embodiments of the invention disclosed herein are applicable to both types of devices. Like regions of the two devices are similarly labeled and function in a similar fashion. Both cross sections include a substrate 101 on which the junction field effect transistors are formed. The substrates can be silicon carbide, silicon, or any other kind of semiconductor material. The devices can include regions of different conductivity types formed through the introduction of dopants. The regions can include regions of a first conductivity type and a second conductivity type. For example, the devices could be formed in a silicon carbide substrate and include p-type regions where the dopant for the p-type regions is aluminum and the dopant for the n-type regions is nitrogen.

The devices in cross sections 100 and 120 include various regions. The devices each include a drift region 102 of a first conductivity type. The drift regions can be formed through the epitaxially growth of a layer on a top surface of the substrate. The doping concentration of the drift region will depend on the breakdown rating of the device. As a non-limiting example, the drift region could be an n-type region for a radiation tolerant device and be formed through epitaxially deposition of materials on the substrate and could have a dopant concentration of between 5e15 to 4e14 per cm$^3$.

The devices in cross sections 100 and 120 also each include shallow well regions 105 of a second conductivity type. In specific embodiments of the invention, the shallow well regions are p-type regions with dopant concentrations of less than 1e18 per cm$^3$ and greater than 5e16 per cm$^3$.

The devices in cross sections 100 and 120 also each include deep well regions 104 of the second conductivity type and located between the shallow well regions 105 and the drift region 102. In specific embodiments of the invention, the deep well regions can be p-type regions with peak dopant concentrations of greater than 5e17 per cm$^3$.

The devices in cross sections 100 and 120 also each include a junction field effect region 103 in contact with the shallow well region, the drift region, and the deep well region, and having a junction field effect doping concentration of the first conductivity type. In specific embodiments of the invention, the junction field effect transistor region of the device can have a doping concentration of less than 1e17 per cm$^3$ and greater than 1e15 per cm$^3$.

The devices in cross sections 100 and 120 also include contact regions. The devices each include source contact regions 106 of the first conductivity type in contract with the shallow well regions 105 and deep well contact regions 107 of the second conductivity type in contact with the deep well regions 104 and the source contact regions 106. In specific embodiments of the invention, the deep well contact regions 107 are also in contact with the shallow well region 133 in a different cross section of the device. The source contract regions 106 can be regions of high dopant concentration and be used to ohmically couple the conductive channel of the transistor to an external contact. The deep well contact regions 107 can also be regions of high dopant concentration and be used to ohmically couple the deep well and shallow well regions with an external contact for purposes of biasing the deep well regions. The cross sections also include drain contacts 108 formed on the back sides of the substrates 101.

The devices illustrated by cross sections 100 and 120 both selectively, when the associated channel is in a conductive state (i.e., the transistor is in an on state), form conductive paths from source contact regions 106 to drain contacts 108 through a channel formed by shallow well regions 105, JFET regions 103, drift regions 102, and substrate 101. The channel is controlled by a potential applied to gate electrodes of the devices which are isolated from the channel by a gate insulator. Both devices each have a gate insulator in the form of a gate insulator 110. In both devices, gate insulator 110 is drawn extending across the top surface of the JFET region. The gate electrode 109 in cross section 100 is a single region of material that controls two distinct physical channels which form the channel of the device. The gate electrodes 121 and 122 in cross section 120 are two regions of material, that can be biased in combination, which each independently control one of two physical channels which form the channel of the device. The channels are created by depleting the majority carriers and eventually inverting the carrier type in the shallow well regions 105 through the application of a potential to the various gate electrodes 109, 121, and 122. In the illustrated case, the substrate 101, drift region 102, and JFET region 103 are all n-type regions. As such, upon depleting shallow well regions 105, the resulting structure will include a continuous chain of n-type regions from the strongly n-type source contact regions 106 to the drain contacts 108 allowing charge carriers to flow through the device with little resistance.

Cross section 120 includes a gate insulator 110 located over a deep well region 104 and shallow well region 105. In generally, the gate insulator 110 will extend past the intersection of the shallow well region 105 with the source contact region 106 and will also extend past the intersection of the shallow well region 105 with the JFET region 103 to assure that the gate electrode has good control over the creation of the channel. Cross section 120 also includes a gate electrode 122 and a gate electrode 121 located over the gate insulator 110. In the case of gate electrode 122 and gate electrode 121, the two electrodes may not necessarily share one continuous strip of gate insulator from one electrode to the other. As illustrated, in the single cross section 120 of the FET, the gate electrode 122 extends past the lateral extent of the shallow well region 105 in a first direction and does not extend past a lateral extent of the deep well region 104 in the first direction. In the illustrated case, the first direction is in the direction towards the JFET region 103 from the source contact region 106. In the case illustrated in cross section 120 of FIG. 1A, gate electrodes 122 and 123 do not extend past the lateral extent of the deep well region. However, cross section 130 of FIG. 1B includes gate electrodes 132 and 131 that do extend past the lateral extent of the deep well region in the first direction. As illustrated, shallow well regions 133 and 134 have a smaller lateral extent when compared with shallow well regions 105. However, in alternative embodiments the shallow well regions 133 and 134 can have the same lateral extent as shallow well regions 105. The remaining elements of FIG. 1B are labeled with like reference numbers as they can generally exhibit the similar characteristics to those regions in the prior figures. Furthermore, in the illustrated cases, gate electrodes 121, 122, 132, and 131 do not extend past the lateral extent of the deep well regions 104 in a second direction away from junction field effect region 103. However, in alternative embodiments, the gate electrodes could also extend past the deep well regions in the second direction. In cross section 140, gate electrode 221 is a single gate electrode that extends across the entire JFET region 103.

Figure 1B:
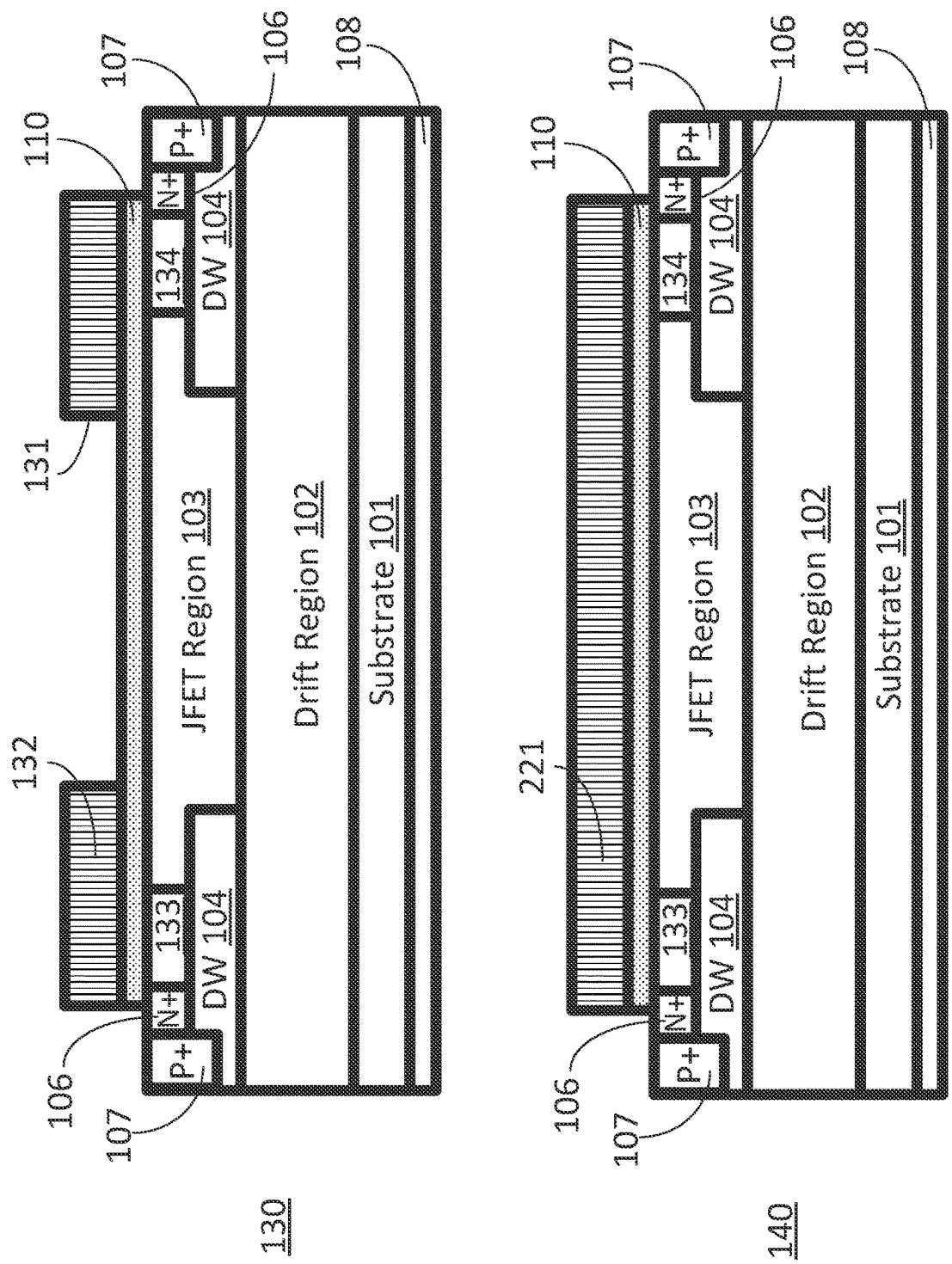
FIG. 1B illustrates a cross section taken from a vertical FET device with a hybrid channel in accordance with specific embodiments of the invention disclosed herein.

Specific embodiments of the invention are not limited by the cross sections in FIGS. 1A and 1B. For example, while FIGS. 1A and 1B illustrate a device where the conductive channel of the device is n-type, a device with a p-type channel could have been formed in the alternative by switching the conductivity type of each of the regions. To refer to both variants, the terms "first conductivity type" and "second conductivity type" will be used herein to refer to two different and opposite conductivity types. The example of an n-type channel device has been used for illustrative purposes because n-type channel devices have higher carrier mobilities and therefore lower on resistances, but either option is within the scope of this disclosure. Furthermore, while the cross sections provided in FIGS. 1A and 1B disclose specific regions being in contact if they share a line boundary in the illustration, such disclosure should not be interpreted to exclude alternative approaches in which there are additional layers and regions added between these regions. For example, the drift region may include buffer layers between the bulk of the drift region and the substrate which help to provide good conductivity between the layers or to assure a given crystal pattern is developed in the drift region as it is formed. As another example, there may be additional layers between the gate insulators and the top surface of the shallow wells and JFET regions which are used to aid in the formation of the gate insulator or to otherwise improve the performance of the device. Furthermore, the thickness of the various regions in the figures is not a limitation of this disclosure. For example, substrates 101 will generally be thicker that the drift region 102 and the JFET region 103.

Specific FET devices that are in accordance with this disclosure exhibit a notch at the intersection of the shallow well and JFET region that is formed by the deep well extending laterally past the shallow well region. For example, the devices in FIGS. 1A and 1B include two such notches formed in the JFET regions 103. This configuration provides significant benefits in that gate insulator 110 at the intersection of the shallow well regions 105 with the JFET regions 103 are shielded by deep well regions 104 form high electric field during device operation. This improves device performance as that intersection affects the gate dielectric reliability. Therefore, shielding the intersection from the high voltages on the drain contacts leads to a more predictably functioning device. Additionally, in the case of split gate devices represented by cross section 120, the entirety of gate electrode 122 and gate electrode 121 are shielded from high electric field during operation by the deep well regions 104 which provides significant benefits not only in reducing drain to gate capacitance but also by increasing the radiation tolerance of the device. Radiation tolerance of the device is improved by lowering the susceptibility of the device to radiation-induced electric-field and a resulting single event gate rupture. In these embodiments, the doping concentration of the shallow well region can be set to determine the threshold voltage of the device. The shallow well region can accordingly be a p-type silicon carbide region with a dopant concentration of less than 1e18 per cm$^3$ and greater than 1e16 per cm$^3$. In these embodiments, the doping concentration of the deep well region can be set to provide adequate shielding to the gate and the interface between the shallow well region and JFET region. The deep well region can accordingly be a p-type silicon carbide region with a concentration of greater than 5e17 per cm$^3$. In specific embodiments of the invention, the resulting MOSFET is radiation tolerant by the deep well region shielding the gate electrode such that it can operate effectively in a radiation field with a LET of greater than 10 MeV/(mg/cm$^2$).

The alignment required to form the notch mentioned in the prior paragraph requires a high degree of precision. In addition, in the case of the split gate devices in cross section 120 and 130, the gate electrode alignment requires an even finer degree of precision and alignment. In the case of cross section 120, the gate electrode overlaps the shallow well to JFET junction completely but is still itself shielded by the deep well region. In the case of cross section 130, the gate electrode overlaps the deep well region to JFET junction completely but does not extend much farther so that a degree of shielding for the gate electrode is still provided by the deep well. The processing methods disclosed herein include approaches to produce such devices with the required degree of precision.

Specific devices that are in accordance with this disclosure exhibit additional benefits in that the well regions can be implanted independently of the JFET regions, and vice versa for the JFET region. As such, both regions have a higher degree of acceptable concentrations that they can be designed to have. Additionally, the JFET region can exhibit a high degree of intentionally designed dopant variability. Specific processing methods disclosed herein allow for the JFET regions and well regions to be independently formed to produce a device that expresses these benefits. For example, in specific embodiments of the invention, the shallow well region of a device, such as shallow well regions 105, are p-type regions with a dopant concentration of less than 1e18 per cm$^3$ and greater than 1e16 per cm$^3$ and the junction field effect transistor region of the device can have a doping concentration of less than 1e17 per cm$^3$ and greater than 1e15 per cm$^3$. As the doping of these two regions does not need to counteract the other, the total concentration of dopants of both layers can be lower than in alternative approaches which results in a device with less electron scattering, hence higher electron mobility and lower on resistance.

Figure 2A:
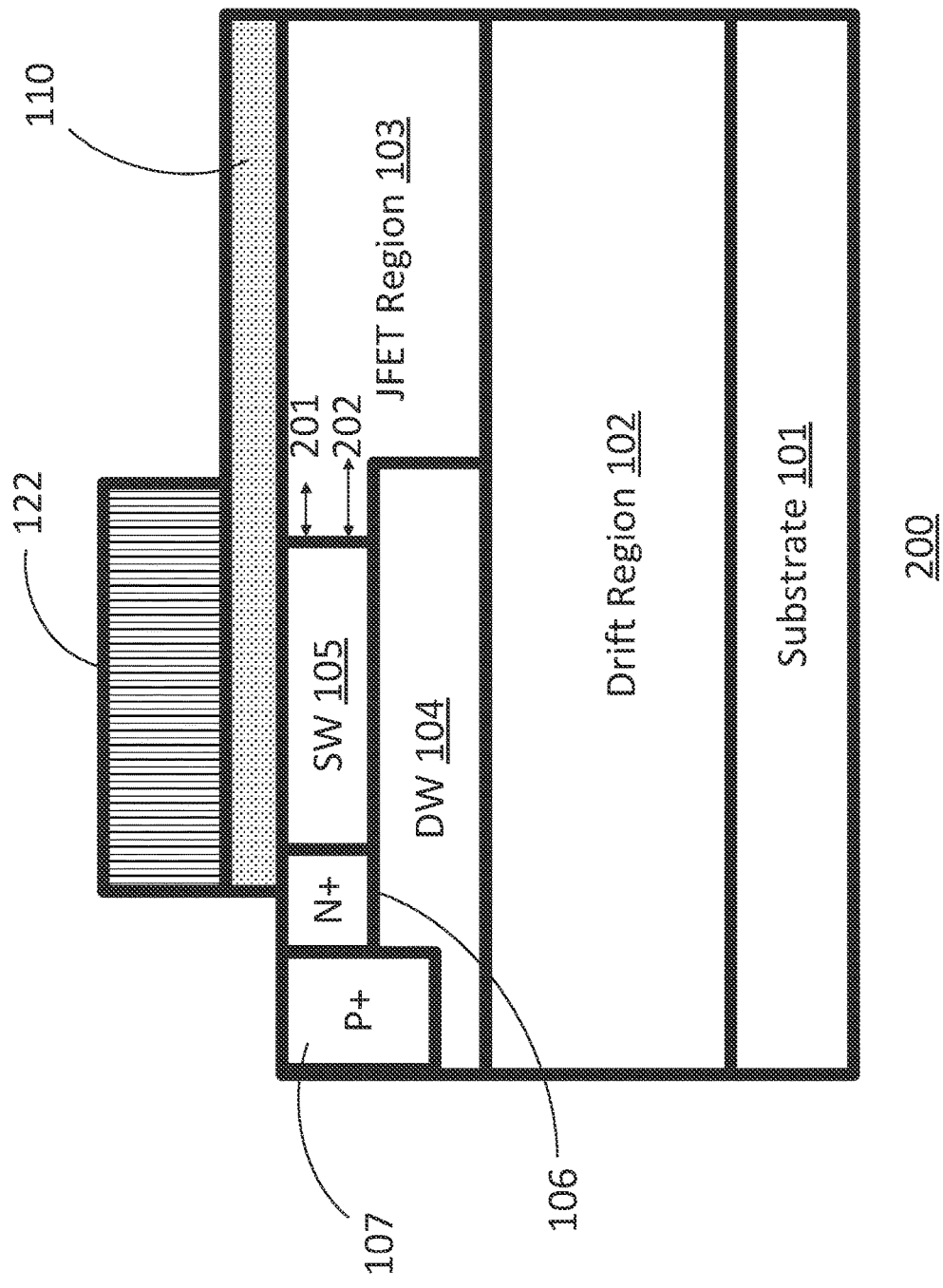
FIG. 2A illustrates a zoomed in view of the split gate type of vertical FET device from FIG. 1A in accordance with specific embodiments of the invention disclosed herein.

FIG. 2A illustrates a zoomed in view 200 of the cross section 120 of the split gate type of vertical FET device from FIG. 1A in accordance with specific embodiments of the invention disclosed herein. Like elements from FIG. 1A are labeled with the same reference numbers in view 200. FIG. 2A includes two labeled dimensions 201 and 202. Dimension 201 shows the degree by which the gate electrode 122 extends past the lateral extent of the shallow well region 105. Dimension 202 shows the degree by which the deep well 104 extends past the lateral extend of the shallow well region 105. The difference between these dimensions will give the distance by which the deep well region 104 extends past the lateral extent of the gate electrode 122.

The dimensions described in the prior paragraph are critical to the performance of the device. The dimensions are particularly important with respect to applications that require radiation tolerance such as in high-altitude aircraft electronics, satellite electronics, or general space applications. The gate electrode 122 extends past the lateral extent of the shallow well region 105 in order to have good control over the junction between the JFET region 103 and shallow well region 105. Additionally, the deep well region 104 extends past the gate electrode 122 in order to provide adequate shielding to the gate electrode and to prevent associated single event burnout events induced by high LET radiation fields. In the single cross section of the FET shown in view 200, the deep well region 104 extends past the lateral extent of the shallow well region 105 in a first direction by greater than 0.2 microns and less than 1 micron. This means that dimension 202 is greater than 0.2 microns and less than 1 micron. The minimum dimension is set to provide adequate shielding for the junction and to assure that there is room for the gate electrode in the split gate devices to extend past the shallow well enough to have adequate control of the junction. The maximum dimension is set in order to reduce the footprint of the device, to reduce gate oxide region on top of the JFET region that experiences high electric field during device operation and during ion bombardment, and to reduce gate-drain capacitance. While a split gate implementation is shown, the extent by which the deep well region extends past the shallow well region is important for single gate approaches as described above. Processes for achieving the precision required to produce devices with these dimensions are described in detail as follows.

Figure 2B:
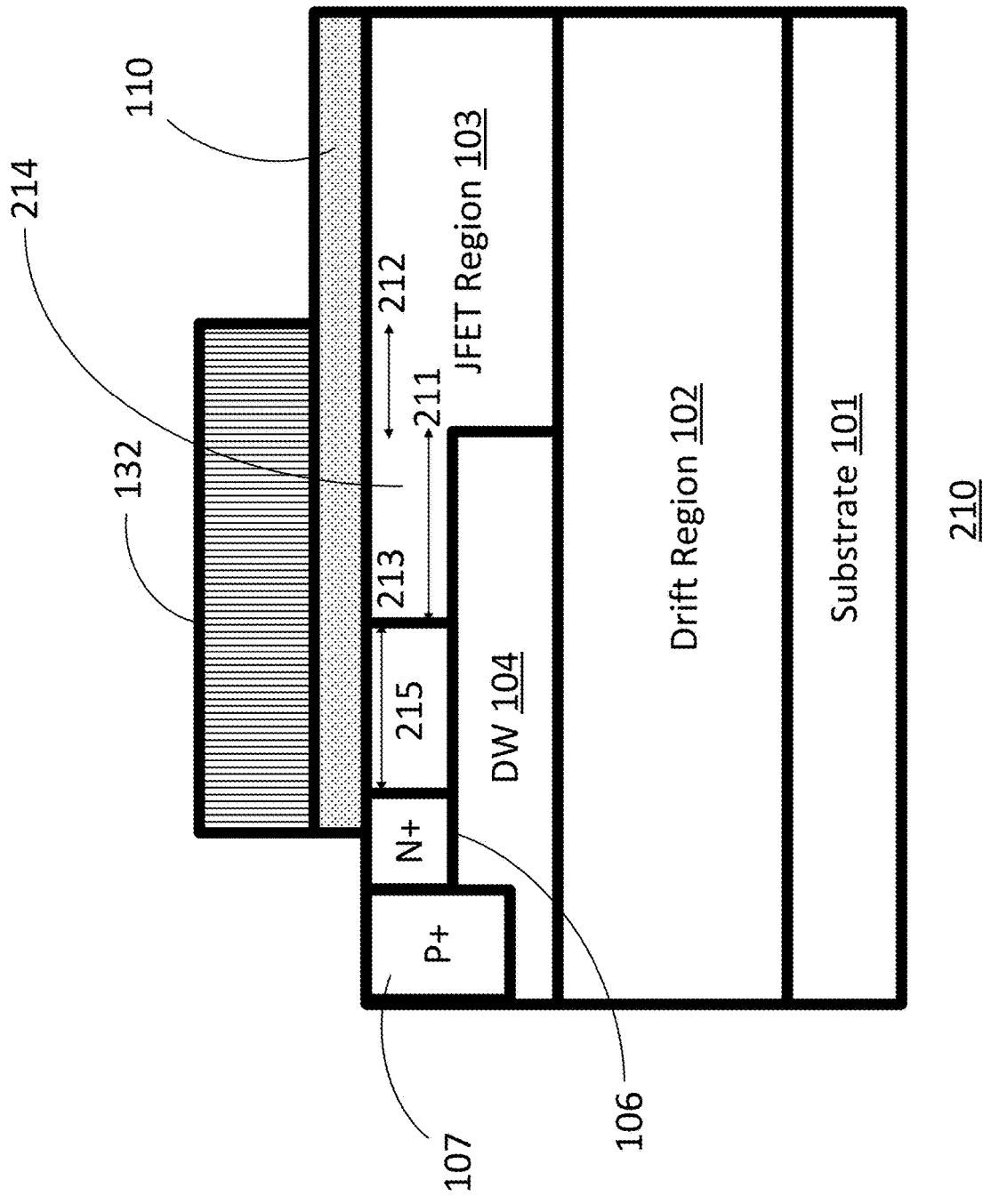
FIG. 2B illustrates a zoomed in view of the split gate type of vertical FET device from FIG. 1B in accordance with specific embodiments of the invention disclosed herein.
Figure 2C:
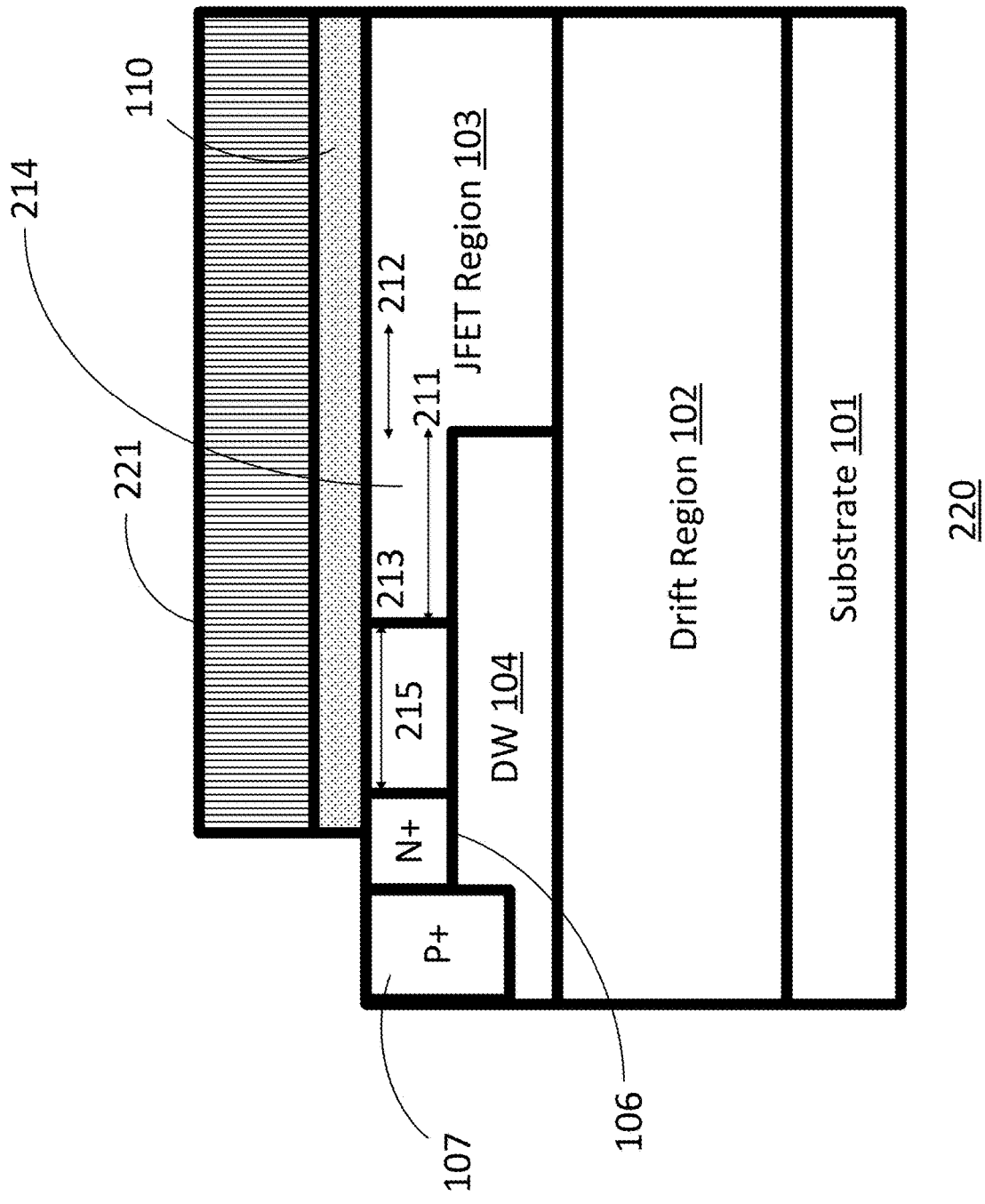
FIG. 2C illustrates a zoomed in view of a vertical FET device with a hybrid channel from FIG. 1B but with a single gate instead of a split gate structure in accordance with specific embodiments of the invention disclosed herein.

FIG. 2C illustrates a zoomed in view of a version of the device shown in FIG. 2B but with a modification in that the gate electrode extends out of the cross section. This is because the illustrated device is part of a single gate structure, such as the one shown in FIG. 1A, with the exception that gate electrode 221 in FIG. 2C controls a hybrid channel as the one described with reference to FIG. 2B.

Figure 2D:
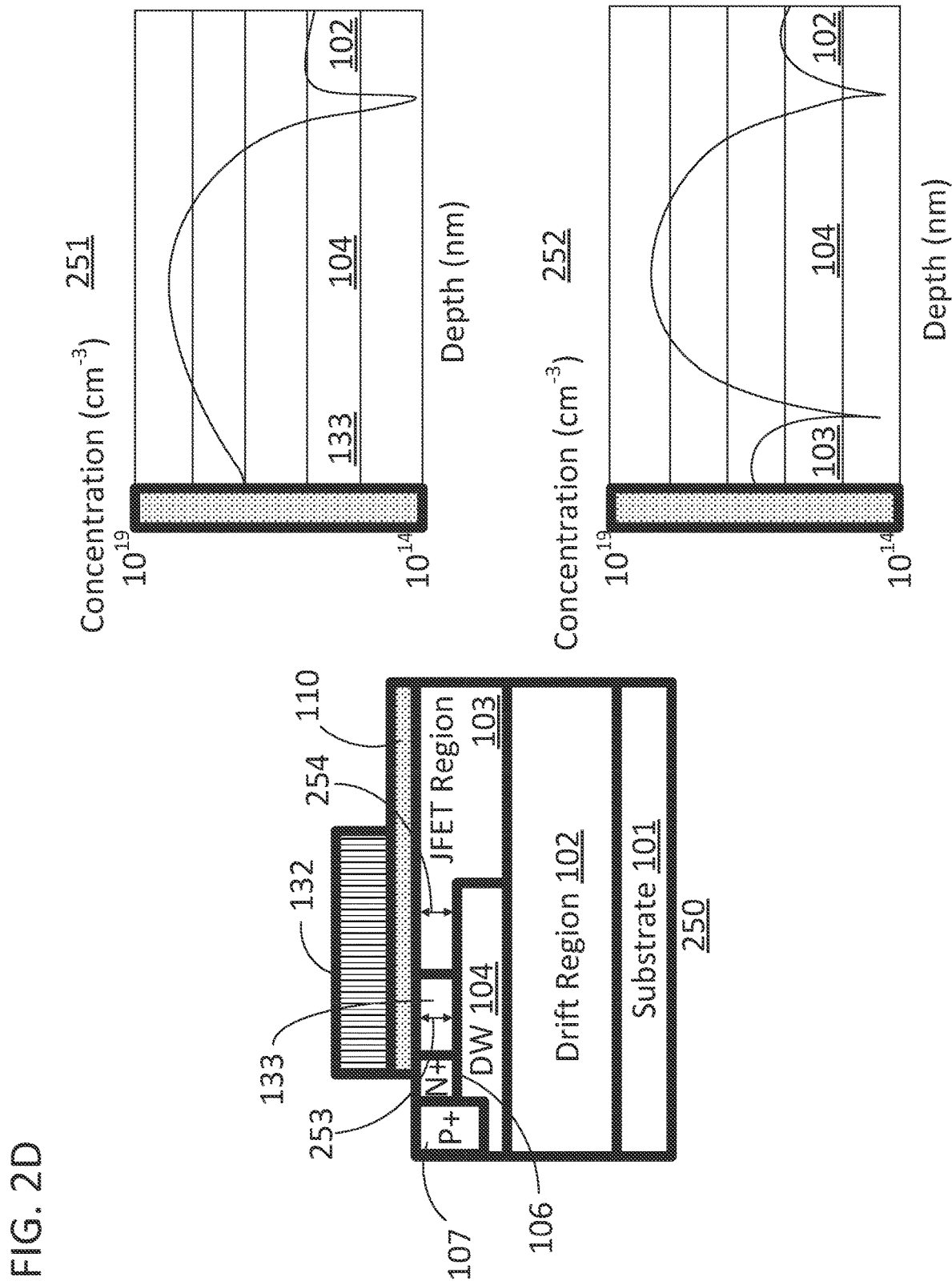
FIG. 2D illustrates a zoomed in view of the split gate type of vertical FET device and two accompanying dopant profiles in accordance with specific embodiments of the invention disclosed herein.

FIG. 2D illustrates a zoomed in view 210 of the cross section 130 of the split gate type of vertical FET device from FIG. 1B in accordance with specific embodiments of the invention disclosed herein. Like elements from FIG. 1B are labeled with the same reference numbers in view 210. FIG. 2B includes three labeled dimensions 211, 212, and 213. Dimension 211 shows the degree by which the deep well region 104 extends past the lateral extend of shallow well region 133. Dimension 212 shows the degree by which the gate electrode 132 extends past the lateral extent of the deep well region 104. Dimension 213 shows the length of shallow well region 133. Dimension 211 shows the degree by which the deep well 104 extends past the lateral extend of the shallow well region 133. The sum of dimensions 211 and 212 will give the distance by which the gate electrode 132 extends past the shallow well region 133.

The dimensions described in the prior paragraph are critical to the performance of the device both in terms of radiation tolerance and, in the case of portion 214 of JFET region 103 being depleted by deep well region 104, critical to the performance of the device overall. The portion 214 of JFET region 103 is located above deep well region 104. In specific embodiments of the invention, the portion 214 of JFET region 103 is fully depleted by the deep well region 104 when the junction field effect transistor is off. The portion 214 can be a region which has residual p-type doping from the tail end of the implant used to form the deep well region 104 which has been converted to n-type region by the blanket deposition that created JFET region 103. This region can be fully depleted of carriers at zero bias to the gate electrode due to the high dopant concentration of deep well region 104. The region can then accumulate carriers during the application of a bias voltage to the gate electrode 132 (e.g., a positive bias voltage applied to gate electrode 132 attracting n-type carriers in an n-type portion 214). As such, portion 214 can form a hybrid channel with shallow well region 133. For this reason, dimensions 215 and 211 are important because they affect the channel length of the device. Furthermore, dimension 212 is important because a proper functioning hybrid channel requires the gate electrode to extend past the portion 214 which is depleted by deep well region 104. Additionally, dimension 212 is important because minimizing the degree by which the gate extends serves to increase the radiation tolerance the device. For example, although the single gate device in cross section 220 of FIG. 2C would function with a hybrid channel approach, it would still suffer from increased exposure of the gate electrode to the drain contact, while the split gate device in cross section 130 would have more shielding on the drain contact.

In the single cross section of the FET shown in view 210, the labeled dimensions can have various values. As illustrated, the deep well region 104 extends past the lateral extent of the shallow well region 133 in a first direction by greater than 0.2 microns and less than 1 micron. This means that dimension 211 is greater than 0.2 microns and less than 1 micron. The minimum dimension is set to control the accumulation mode channel of the hybrid channel device. As illustrated, the shallow well region 133 extends from the junction with the JEFT region 103 to the source contact 106 for a distance farther than 0.2 microns and less than 1 micron. This means that dimension 213 is greater than 0.2 microns and less than 1 micron. The dimension is set to control the inversion mode channel of the hybrid channel device. As illustrated, the gate electrode 132 extends past the lateral extent of the deep well region in the first direction by greater than 0.2 microns and less than 1 micron. This means that dimension 212 is greater than 0.2 microns and less than 1 micron.

The characteristics of hybrid channels that are in accordance with specific embodiments of the invention can be described with reference to FIG. 2C which include cross section 250 and two dopant concentration plots, plot 251 and plot 252. Cross section 250 is the same as cross section 210 but with the dimensions 253 and 254 labeled on the cross section in place of those in cross section 210. The x-axes of plot 251 and plot 252 are the depth into the substrate in nanometers from the gate insulator 110. The y-axis of plot 251 is the dopant concentration per $cm^3$ of either conductivity type of dopant moving along dimension 253. The y-axis of plot 252 is the dopant concentration per $cm^3$ of either conductivity type of dopant moving along dimension 254. The regions through which each associated dimension extends moving away from the gate insulator 110 are likewise labeled on the plots (e.g., shallow well region 133, deep well region 104, and drift region 102 for plot 251). The hybrid channel is formed along gate insulator 110 through both plot 251 and 252 with plot 251 showing a characteristic dopant concentration for an accumulation mode channel and plot 252 showing a characteristic dopant concentration for an inversion mode channel.

In specific embodiments of the invention, the two portions of the hybrid channel have different characteristics. In specific embodiments of the invention, the inversion mode channel is a p-type region close to the gate electrode which is formed by the shallow well region implant and the deep well region implant. The surface is inverted to n-type by applying a positive bias to the gate. The threshold voltage can be approximately 4.5 volts. In specific embodiments of the invention, the accumulation mode channel is an n-type region close to the gate electrode which is formed by the deep well implant, which leaves a lightly p-type region close to the gate electrode, followed by the JFET region implant which converts the surface doping from p-type to a lightly n-type accumulation region. As stated previously, the n-type accumulation channel is completely depleted by the built-in potential of the junction with the deep well region (p-type in this example) which creates a potential barrier for electrons at zero gate bias in the blocking mode (i.e., transistor off). In this sense, the accumulation mode channel is formed in the JFET region under the influence of the deep well region. Current transport in the accumulation mode channel occurs when a positive gate bias induces accumulation of carriers in the accumulation region to create an enhancement mode device. The threshold voltage can be approximately 2 volts which is the point at which the fully depleted n-type region is turned on to form non-rectifying contract from the source to drain through the JFET region.

In specific embodiments of the invention, the two portions of the hybrid channel have different characteristics provide synergistic benefits. For example, the channel lengths of the inversion channel and the accumulation channel can be tuned in tandem to achieve high performance for both blocking characteristics and low on resistance. In the case of inversion mode SiC FETs, channel resistance accounts for almost 65 percent of total on resistance. Reducing the length of the channel reduces on resistance, however, when the drain voltage rises, a shorter channel length decreases the potential barrier at the source. As a result of the lower potential barrier, carrier injection from the source could contribute to enhanced drain to source leakage. As an alternative approach, an accumulation mode channel device could be used resulting in a nearly 2× improvement in carrier mobility compared to the inversion mode channel. However, in specific embodiments such a device must be designed with minimum channel length of about 0.5 microns or more to minimize drain to source leakage. In a hybrid channel device, an inversion mode channel forms in the shallow well region, while an accumulation model channel forms in the JFET region portion above the deep well region. The accumulation mode channel region protects the inversion channel from the JFET region's high electric field, reducing short channel effects. At the same time, when compared to a pure accumulation channel device, the hybrid channel design may allow for reduced channel lengths for the inversion mode channel while still gaining advantages in terms of lower leakage when the device is off, and improved avalanche energy density.

Figure 3:
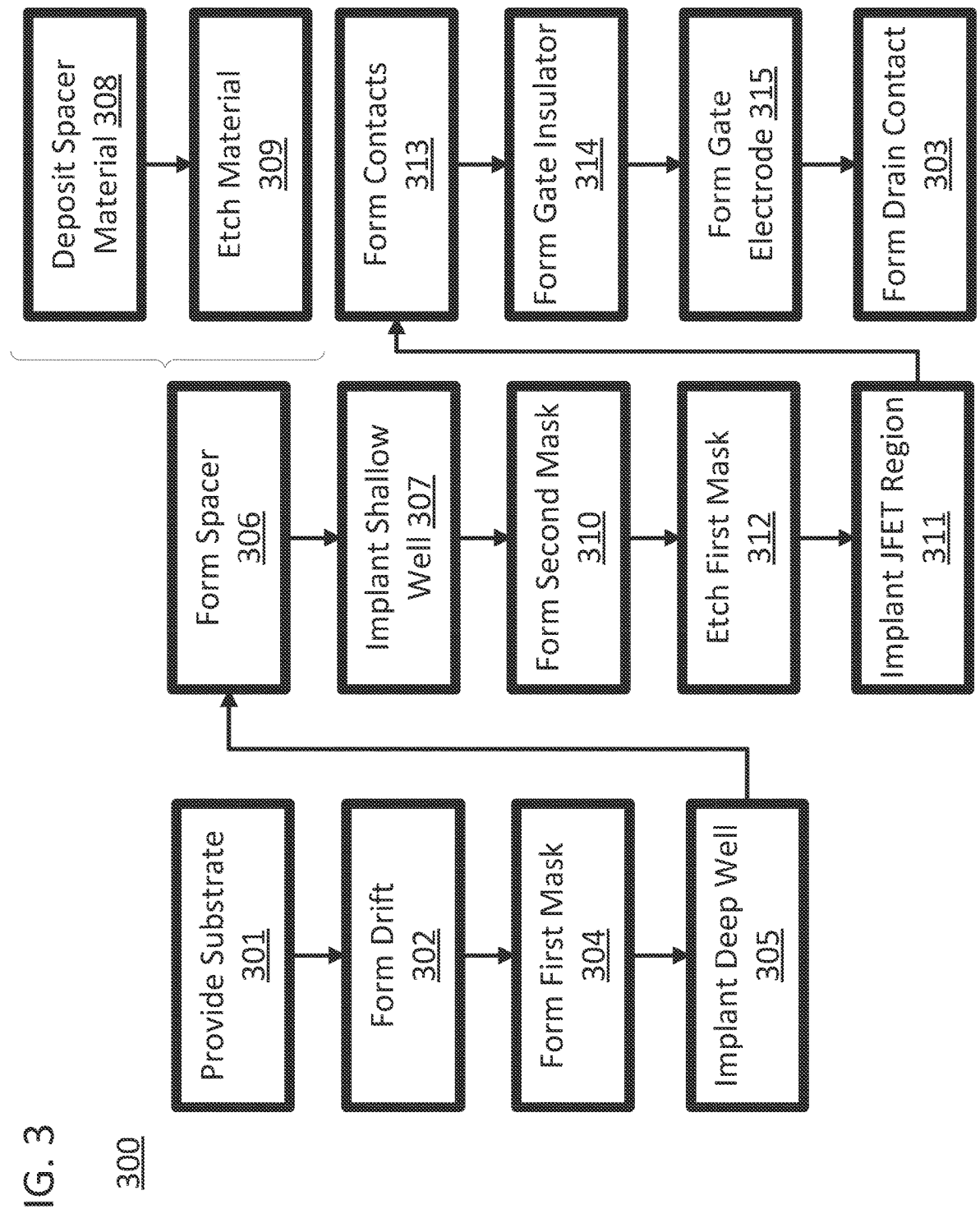
FIG. 3 illustrates a flow chart for a set of methods for forming a FET device that are in accordance with specific embodiments of the invention disclosed herein.

FIG. 3 illustrates a flow chart 300 for a set of methods for forming a FET device that are in accordance with specific embodiments of the invention disclosed herein. Specific embodiments of the various steps of flow chart 300 can be described with reference to the cross sections in FIGS. 4-10. The methods include processes for forming a field effect transistor. The FETs formed using the disclosed processes can exhibit the device characteristics described above with reference to FIGS. 1A and 1B.

A process for forming a FET device in accordance with flow chart 300 can being with a step 301 of providing a substrate. The substrate can be a silicon carbide substrate, silicon substrate or any kind of semiconductor material. The substrate can be doped with a relatively high concentrations of dopants such that it has a first conductivity type or a second conductivity type. The substrate could be silicon carbide substrate doped with nitrogen to form an n-type substrate or doped with aluminum to form a p-type substrate. For example, the substrate can be a strongly n-type substrate with a doping concentration somewhere in the range of 1e19 per cm$^3$ to 1e20 per cm$^3$. The FET transistors of FIGS. 1A and 1B can be formed on such a silicon carbide substrate.

Figure 4:
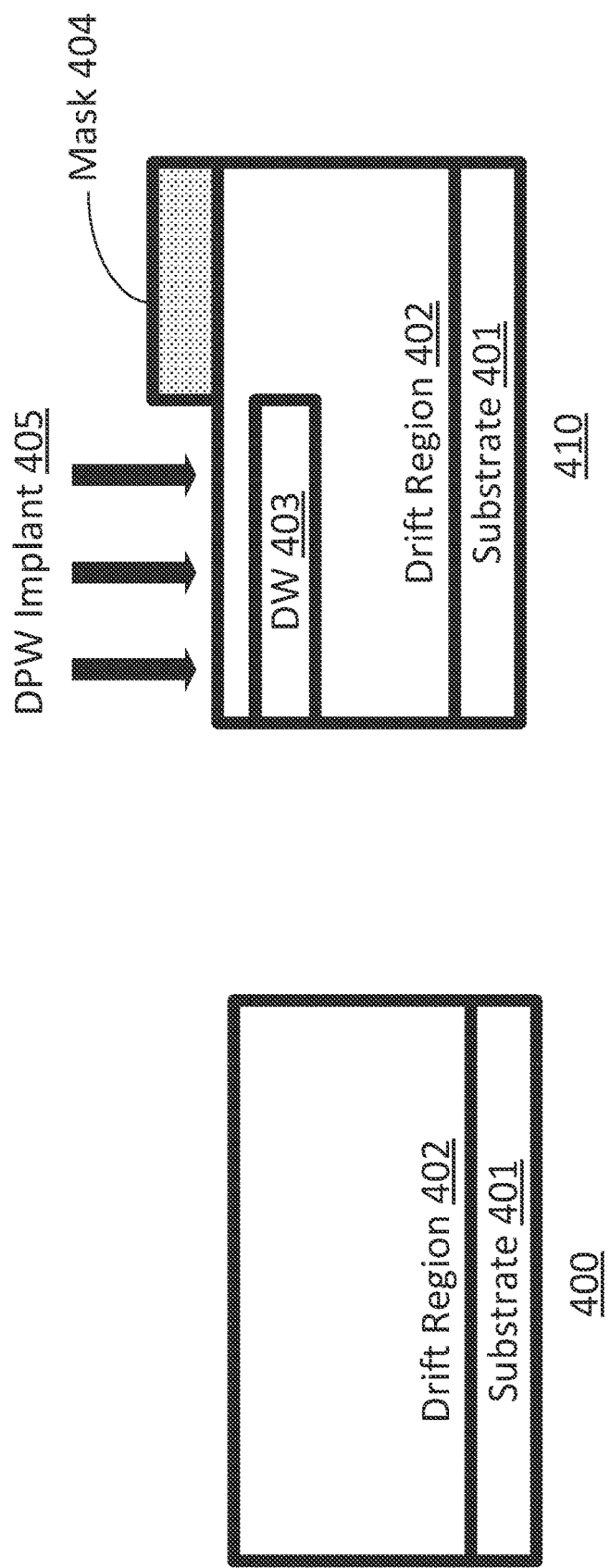
FIG. 4 illustrates the formation of a deep well region for a FET device in accordance with specific embodiments of the invention disclosed herein.
Figure 5:
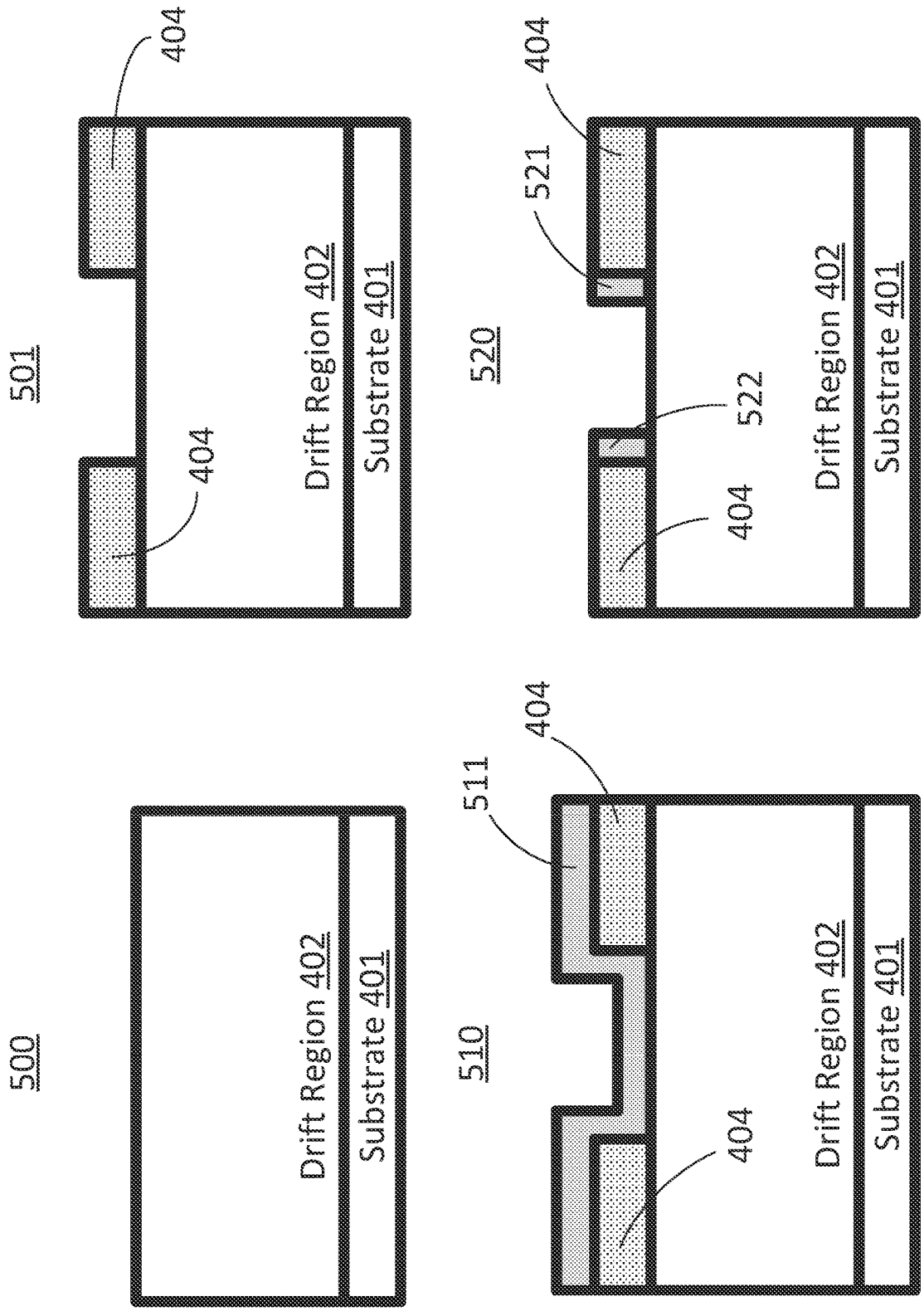
FIG. 5 illustrates the formation of a spacer for a FET device in accordance with specific embodiments of the invention disclosed herein.

Flow chart 300 continues with a step 302 of forming a drift region on the substrate. The drift region can be an n-type drift region for decreased on resistance in the resulting device. However, both n-type and p-type drift regions are within the scope of this disclosure. The drift region can be an epitaxially layer grown on the surface of the substrate. The drift region can be formed on one or more buffer layers that adjust for any discrepancies between the crystal structure of the substrate and the drift region, or to otherwise provide for the formation or performance of the drift region. In specific embodiments of the invention, the drift region will be approximately 5 to 30 microns thick. In specific embodiments of the invention, the drift region will have a doping concentration the is determinative of the breakdown rating of the device. In approaches in which the FET device is radiation tolerant, the drift region can be an epitaxially layer with a doping concentration between 1e16 per cm$^3$ to 4e14 per cm$^3$. FIG. 4 illustrates a cross section 400 of a substrate 401 on which a drift region 402 has been formed in accordance with the execution of specific embodiments of steps 301 and 302.

Flow chart 300 also includes a step 304 of forming a first mask. The first mask can be a hard mask. The first mask can be formed of silicon dioxide, silicon nitride, or some other material. The first mask material can be blanket deposited on the surface of the drift region to form the mask material and then the mask can be formed by patterning the mask material with a photolithography process. The blanket deposit can be conducted via plasma deposition or some other process. In specific embodiments of the invention, the drift region and substrate are silicon carbide and the mask material is silicon dioxide which is blanket deposited, using plasma deposition, on the drift region so that the process is generally faster and less temperamental than that growth of a thick layer of silicon dioxide. Furthermore, using this process no damage occurs to the silicon carbide surface through oxidation and other interface issues at the silicon carbide to silicon dioxide interface. In specific embodiments of the invention, the drift region 402 is topped with polysilicon, silicon nitride, or some other material to shield the drift region 402 from contact with the deposited mask material. This material can also be used as an etch stop during the etching used to form mask 404 from the deposited mask material.

Flow chart 300 also includes a step 305 of implanting a deep well region in a drift region using the first mask. The implant can be used to modify the dopant concentration of a region of the drift region, which will become the deep well region, through the implanting of dopants to reverse the conductivity type of that region. For example, if the drift region were an n-type region, the deep well region could be a p-type region. The concentration of the p-type region could be high to provide adequate shielding to the remainder of the device and to allow the characteristics of the shallow well region to dominate and determine the threshold voltage, and other operational characteristics, of the device. In specific embodiments of the invention, the drift region is n-type, the substrate is silicon carbide, and the implant species for the implanting of the deep well region is aluminum. For example, the deep well region could be formed through the implantation of aluminum using a 250 KeV to 500 KeV implant to create a deep well with a dopant concentration of 5e17 per cm$^3$ to 1e19 per cm$^3$ at a depth of 0.4 to 0.8 microns. FIG. 4 illustrates a cross section 410 where a first mask 404 has been formed and is being used by a deep well implant 405 to form deep well region 403 in drift region 402 in accordance with the execution of specific embodiments of steps 304 and 305.

Flow chart 300 also includes a step 306 of forming a spacer in contact with the first mask formed in step 304, The spacer can be formed in order to create the notch described with reference to FIGS. 1 and 2. The spacer can accordingly have a width, measured across a surface of the substrate, of greater than 0.2 microns and less than 1 micron. In specific embodiments of the invention, the spacer and the first mask can both be hard mask material. In specific embodiments of the invention, the spacer and the first mask can both be silicon dioxide.

Step 306 in flow chart 300 includes sub-steps that are in accordance with specific embodiments of the disclosed invention. These sub-steps can be described with reference to FIG. 5 which illustrates a series of cross sections 500, 501, 510, and 520 showing the formation of the spacer. The sub-steps include sub-step 308 of depositing a spacer material on the first mask and a sub-step 309 of anisotropically etching the spacer material. Sub-step 308 can include blanket depositing 5000 angstroms of spacer material across the surface of the substrate and over the first mask. For example, a plasma deposition of silicon dioxide. Sub-step 309 can include anisotropically etching the deposited spacer material to form a spacer with a width, measured across the surface of the substrate, of approximately the same width as the blanketed material (i.e., in this specific example—5000 angstroms). Cross section 500 includes drift region 402 and substrate 401. In specific embodiments of the invention, drift region 402 will be topped with a polysilicon or silicon nitride layer which will serve as an etch stop layer at oxide spacer etch to form the spacer. Cross section 510 illustrates an example execution of sub-step 308 of depositing a spacer material 511 on the first mask 404. Cross section 520 illustrates an example execution of sub-step 309 of anisotropically etching spacer material 511 to form spacers (e.g., spacer 521 and spacer 522). The etching in this step can include using an etch stop material on the surface of the drift region 402 which is not illustrated in the figures. Also, although the spacers are shown as having sharp edges after being etched, the anisotropic etch may tend to form a spacer with a curved edge. The curved edge may extend from the top of the first mask 404 down to the surface of the drift region 402.

Flow chart 300 also includes a step 307 of implanting a shallow well region in a drift region using the first mask formed in step 304 and the spacer formed in step 306. The implant can be used to modify the dopant concentration of a region of the drift region, which will become the shallow well region, through the implanting of dopants to reverse the conductivity type of that region. For example, if the drift region were an n-type region, the shallow well region could be a p-type region. The concentration of the p-type region could be moderate to set the threshold voltage of the FET device while keeping the on resistance of the device low. In specific embodiments of the invention, the drift region is n-type, the substrate is silicon carbide, and the implant species for the implanting of the shallow well region is aluminum. In specific embodiments, the implant species for both the shallow well region and the deep well region is aluminum. For example, the shallow well region could be formed through the implantation of aluminum using a 100 KeV to 200 KeV implant to create a shallow well region with a dopant concentration of 5e16 per cm$^3$ to 1e18 per cm$^3$ extending from the surface of the drift region down to the deep well region. In specific embodiments of the invention, the resulting FET will have a threshold voltage of 3 volts to 5 volts. The relatively large threshold voltage for the device can be useful in high power applications to assure that noise or radiation do not cause the device to turn on accidentally.

Figure 6:
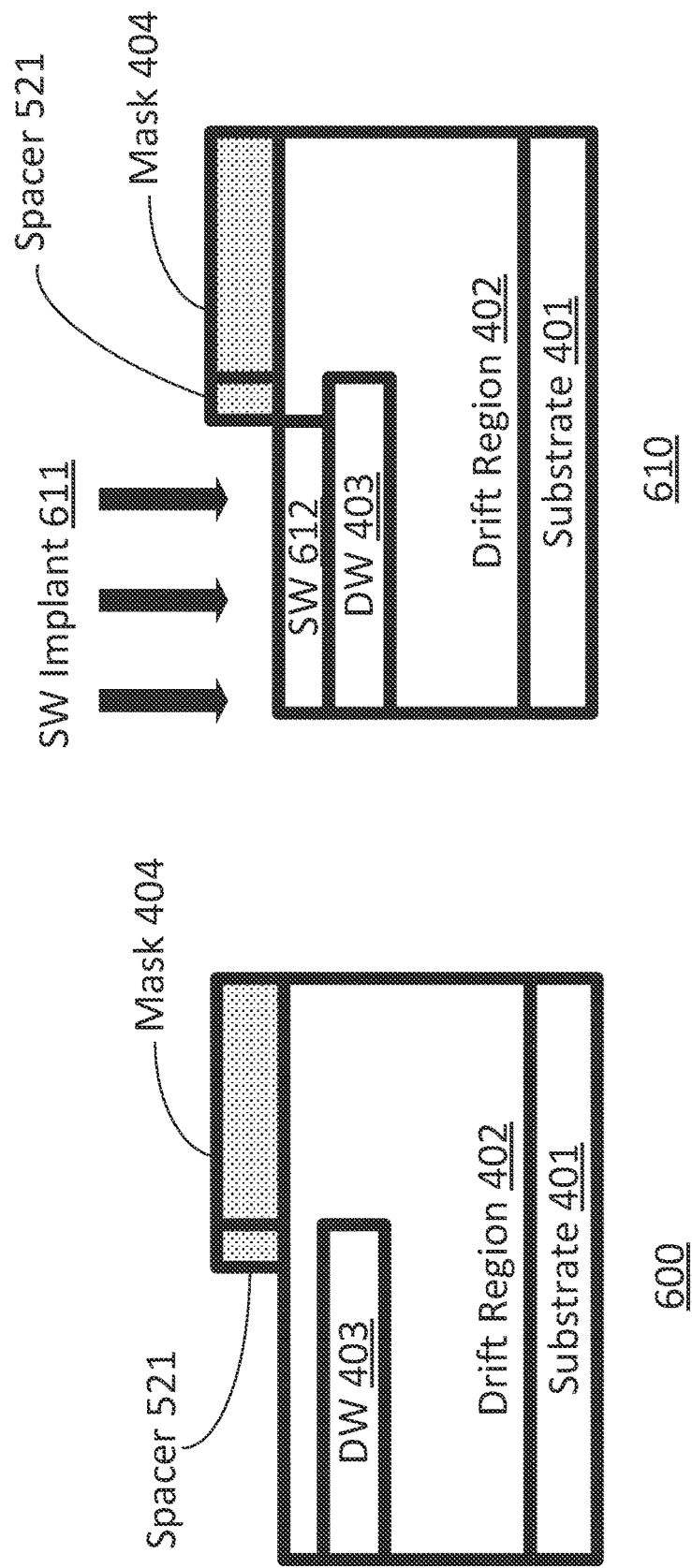
FIG. 6 illustrates the formation of a shallow well region for a FET device in accordance with specific embodiments of the invention disclosed herein.

FIG. 6 illustrates a cross section 600 where a first mask 404 and spacer 521 have been formed in accordance with the execution of specific embodiments of steps 304 and 306. FIG. 6 additionally illustrates a cross section 610 where the first mask 404 and spacer 521 are being used by a shallow well implant 611 to form shallow well 612 in drift region 402 in accordance with the execution of specific embodiments of step 307.

FIG. 6 illustrates the creation of a shallow well region 612 with a perfectly vertical edge in contact with drift region 402. This edge is important as it determines the effective width of the notch. There are several reasons why the edge may not be perfectly vertical. For example, if the mask formed by spacer 521 and mask 404 is not sufficiently thick, the shallow well implant 611 could punch through the mask and result in a less precise implant. As such, it is important to use a mask of sufficient thickness to avoid this occurrence. As another example, there is the potential for vertically implanted dopant species in implant 611 to spread laterally, particularly at high energies. As such, when using high implant energies this effect needs to be taken into account in order to assure the dimensions of the notch. As another example, if the mask itself is not perfectly vertical than implanted dopants can pile up at the surface. To alleviate this concern, it is important to carefully control the sidewall profile of mask 404 prior to the formation of spacer 521 as a well-controlled profile of mask 404 will militate against this potential defect.

Flow chart 300 includes a step 310 of forming a second mask using the first mask and the spacer and a step 311 of implanting a junction field effect region in the drift region using the second mask. The resulting junction field effect region can be in contact with the shallow well region, the drift region, and the deep well region. As will be apparent from the cross sections displayed in FIGS. 7 and 8, the JFET implant is done in a single step. Also, the JFET implant and the shallow well implant are not conducted into the same regions such that they do not need to account for the doping of the other implant which increases the acceptable range of concentration values the two regions can express in a final device.

Figure 7:
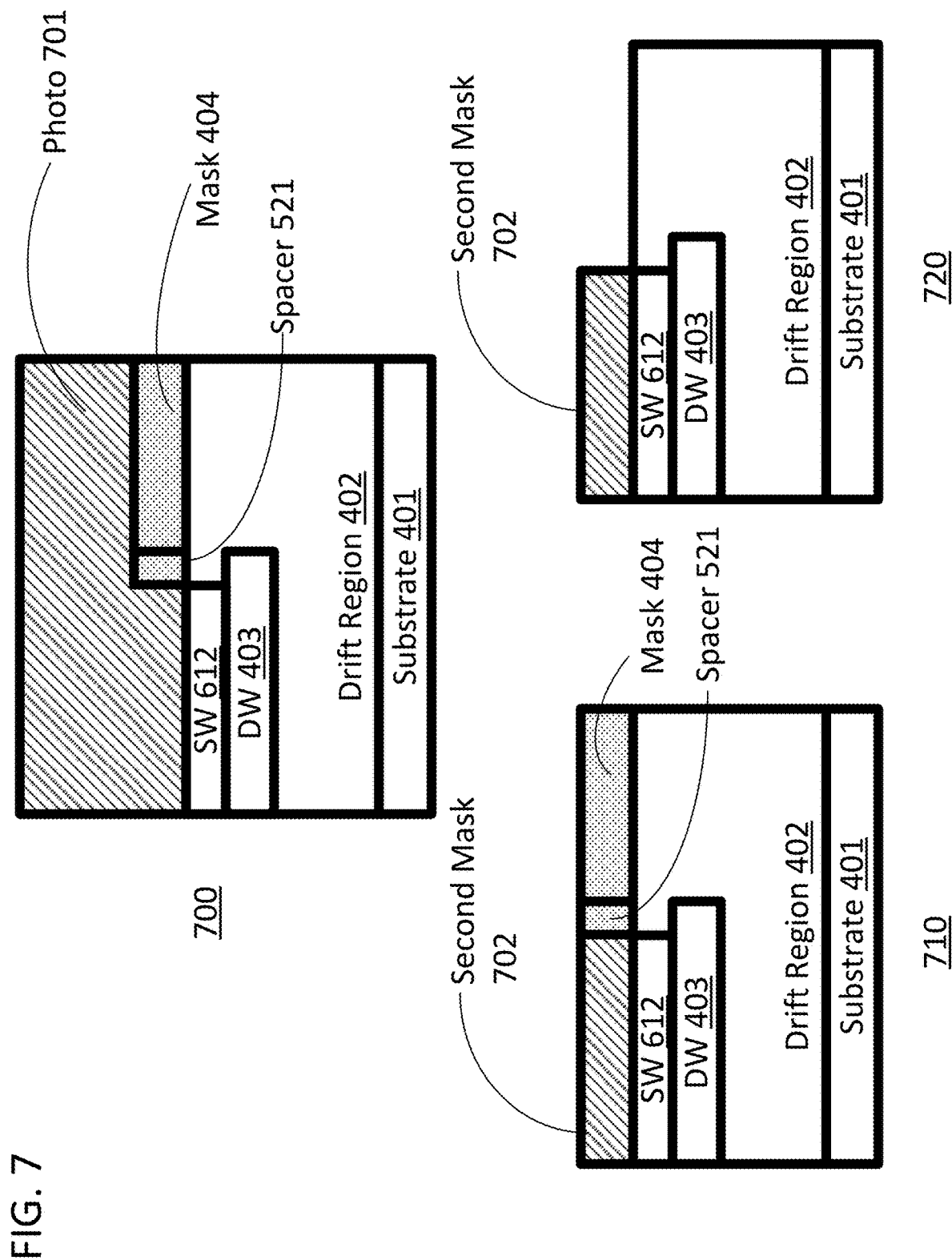
FIG. 7 illustrates the formation of a mask for a junction field effect region implant for a FET device in accordance with specific embodiments of the invention disclosed herein.

FIG. 7 illustrates three cross sections to show the formation of a second mask in accordance with specific implementations of step 310. In specific embodiments of the invention, the first mask is a hard mask and the second mask is a photoresist mask. Cross section 700 illustrates the blanket deposition of a photoresist layer 701. Cross section 710 illustrates the same cross section after an etching or a combination of reduced photo exposure and extended resist develop cycles process is used to remove the photoresist mask at any point higher than mask 404 which effectively forms second mask 702. Flow chart 300 additional includes a step 312 of etching away the first mask after forming the second mask and prior to implanting the junction field effect transistor region in step 311. The effect of this process is illustrated in cross section 720 which shows mask 404 and spacer 521 being removed to leave second mask 702 behind.

Figure 8:
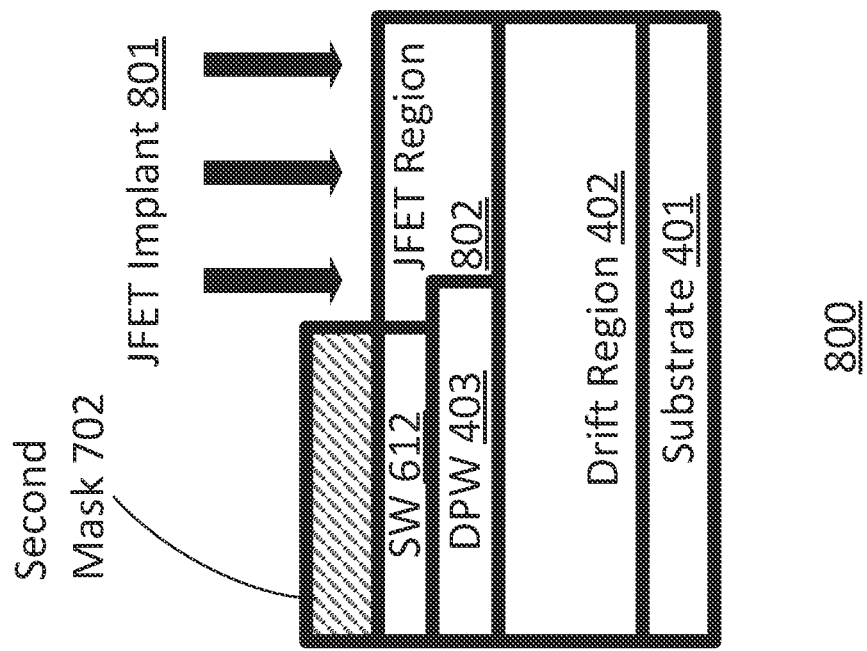
FIG. 8 illustrates the formation of a junction field effect region for a FET device in accordance with specific embodiments of the invention disclosed herein.

FIG. 8 illustrates a cross section 800 to show a specific implementation of the execution of step 311 from FIG. 3 in which the application of JFET implant 801 forms junction field effect region 802. Junction field effect region 802 can be an n-type region with a higher doping concentration than drift region 402. The doping concentration of junction field effect region 802 has an impact on the on resistance of the MOSFET device. In silicon carbide FETs, JFET implant 801 can utilize an implant of nitrogen dopant species to form a region with a dopant concentration of 1e15 per $cm^3$ to 1e17 per $cm^3$. Using this approach, the dopant concentration of the junction field effect region 802 can be tailored to meet the device performance requirements.

Figure 9:
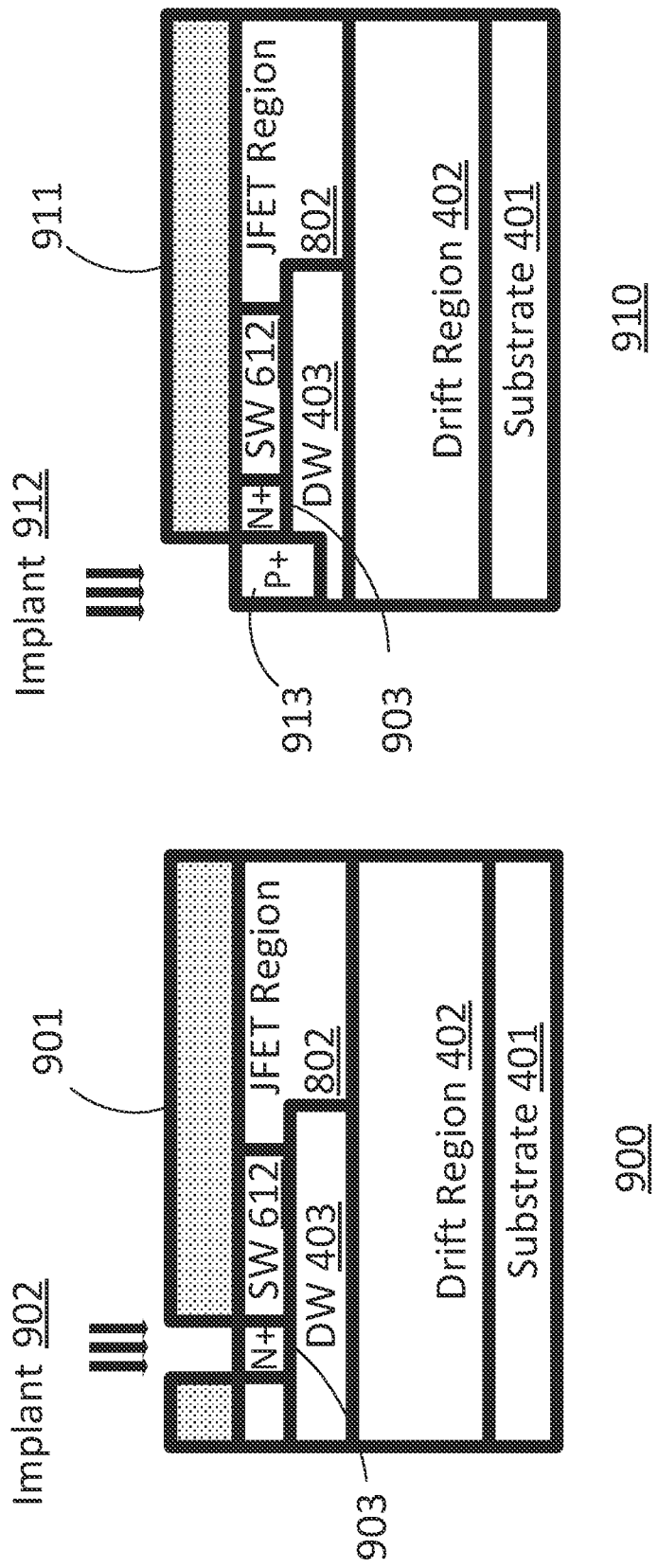
FIG. 9 illustrates the formation of a source contact region and a body contact region for a FET device in accordance with specific embodiments of the invention disclosed herein.

FIG. 9 illustrates two cross sections 900 and 910 to show a specific execution of step 313 in FIG. 3 in which the source region and body contact region of the device are formed. Step 313, as illustrated by cross section 900, includes a sub-step of forming a fourth mask 901 over the junction field effect region 802 and the shallow well region 612, and a sub-step of implanting a source contact region 903 in the shallow well region 612 using the fourth mask 901. The source contact implant 902 can create a heavily concentrated source contact region. For example, in the case of an n-channel device, the source contact region can be doped using a heavy nitrogen implant to create a source contact region have a dopant concentration of between 1e19 per $cm^3$ and 1e20 per $cm^3$. Step 313, as illustrated by cross section 910, also includes a sub-step of forming a fifth mask 911 over the junction field effect region 802, the shallow well region 612, and the source contact region 903, and a sub-step of implanting a deep well contact region 913 in the shallow well region 612. The deep well contact implant 912 can create a heavily concentrated deep well contact region. For example, in the case of an n-channel device, the deep well region can be doped using a heavy aluminum implant to create a body contact region that extends into the deep well region 403 and that has a dopant concentration of between 1e19 per $cm^3$ to 1e20 per $cm^3$. The deep well contact implant 902 can be approximately ten times or more concentrated than the implant used to form the deep well region 403. The deep well contact implant 902 can also be referred to as the well contact because it will also bias the shallow well region. The fifth mask 911 may reuse portions of the fourth mask 901 or be formed entirely of new material. The alignment of the fourth mask to the junction of the shallow well region 612 and JFET region 802 is an important aspect of the device fabrication as precise placement of the source contact region results in precise control of the channel length and on resistance of the device.

Flow chart 300 continues with a step 313 of forming a gate insulator over the deep well region and the shallow well region and a step 315 of forming a gate electrode over the gate insulator. Step 315 can include a sub-step of forming, in alignment with the deep well region, a mask, and a sub-step of forming the gate electrode over the gate insulator using the mask. In the case of a split gate device, such as that represented by cross section 120, the mask's alignment with the shallow well region 105 and deep well region 104 is important because it controls whether or not enough gate electrode material has been removed for the gate electrode 122 to be fully shielded by the deep well region 104 in radiation tolerant applications, or whether or not enough gate electrode material has been kept on for the gate electrode 122 to extend past the lateral extent of the deep well region when the notch of the JFET region is being used as an accumulation type channel. In specific embodiments of the invention, these steps can include forming a gate insulator over the deep well region and the shallow well region, and forming a gate electrode, over the gate insulator, using a mask. As a result of these steps, in a single cross section of the junction field effect transistor, the gate electrode can extend past the lateral extent of the shallow well region in a first direction but may or may not extend past a lateral extent of the deep well region in the first direction. For example, gate electrode 109 extends past the right deep well region 104 towards the right of the device along the illustrated cross section but does not extend past the right deep well region 104 towards the left of the device along the illustrated cross section. In alternative embodiments, the gate electrodes may not extend past the lateral extent of the deep well regions in either direction. For example, gate electrode 122 does not extend past the right deep well region 104 in either direction along the illustrated cross section.

In specific embodiments of the invention, the gate insulator and gate electrode can exhibit various characteristics and be formed in various ways. For example, the gate insulator could be a 300 angstrom to 750 angstrom thick layer of silicon dioxide. The silicon dioxide could be formed through a form of deposition such as a plasma deposition, or through the thermal oxidation of silicon carbide. As another example, the gate electrode can be polysilicon formed through a deposition step such as low-pressure chemical vapor deposition. The gate electrode could have a thickness of 2000 angstroms to 6000 angstroms and have a dopant concentration between 1e20 per $cm^3$ and 1e21 per $cm^3$.

Flow chart 300 also includes a step 303 of forming a drain contact on a back side of the substrate. This step can be preceded by the thinning of the substrate to decrease the on resistance of the FET device. In specific embodiments, the substrate can be thinned to below 300 microns before the drain contact is formed on the back side of the substrate.

Figure 10:
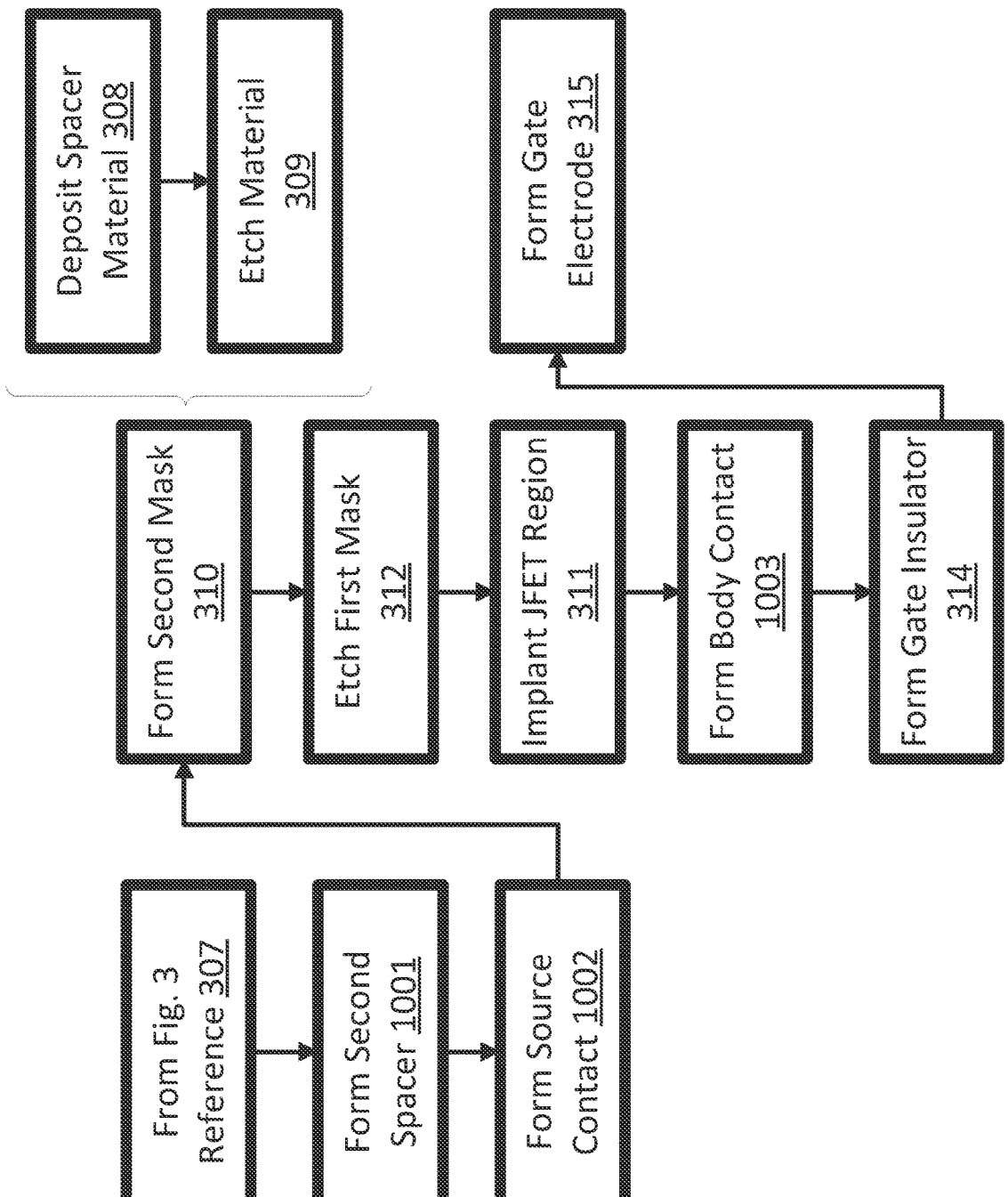
FIG. 10 illustrates a flow chart for a set of methods for forming a FET device that are in accordance with specific embodiments of the invention disclosed herein.

FIG. 10 illustrates a flow chart 1000 for an alternative set of method for forming a FET that are in accordance with specific embodiments disclosed herein. Similar steps in flow chart 1000 from flow chart 300 are labeled using the same reference labels. As illustrated, flow chart 1000 begins with step 307 from flow chart 300 and continues with a step 1001 of forming a second spacer and a step 1002 of forming a source contact. The second spacer can be in contact with the spacer formed in step 306. The source contact can be formed using a similar implant to that described with reference to step 313 in flow chart 300. However, the implant used to form the source contact in step 1002 can use the first mask from step 304, the first spacer from 306, and the second spacer from step 1002 as a mask to guide the implant.

Figure 11:
FIG. 11 illustrates the formation of a source contact region and a JFET region in accordance with specific embodiments of the invention disclosed herein

A process of forming a source contact is illustrated in cross section 1110 in FIG. 11. As illustrated, step 1002 can be conducted by implanting 902 a source contact region (marked N+) in the shallow well region 612 using the second spacer 1101, the spacer 521, and the first mask 404. The step can also involve the formation of another mask 1102. The interface of the source region and the shallow well region is important because it sets the length of the shallow well region portion of the hybrid channel. Using the process of flow chart 1000 described above, this interface is self-aligned to the deep well region and also to the shallow well region, and the length is set by the well-controlled width of second spacer 1101. In specific embodiments of the invention, the second spacer has a width measured across a surface of the substrate, of greater than 0.2 microns and less than 1 micron.

After the source contact has been formed in step 1002, many of the remaining steps can be conducted in the same way as they are in the methods associated with flow chart 300. For example, cross section 1120 illustrates how the JFET implant 1122 to create JFET region 1123 uses a second mask 1121 that has been formed using spacer 521 and mask 404 as a negative. However, later on in the process flow, the step 313 of forming the contacts in flow chart 300 is not required because the source contact has already been formed and can be replaced with a step 1003 of forming a body contact.

The alignment of various features of the devices that have been described in this disclosure can be provided in various ways. For example, while the spacer and first and second masks illustrated in FIGS. 4-7 provide alignment of the shallow well region, deep well region, and JFET region, alternative features can be aligned using different methods. In particular, the alignment of the gate electrode to the deep well in the split gate configuration, and the alignment of the source contact region to the shallow well region (via its alignment to the deep well region) in either the single gate or split gate implementations of the device, are important aspects of the design that need to be carefully controlled in specific embodiments of the invention. One such approach for aligning these features is described with reference to FIG. 10.

Figure 12:
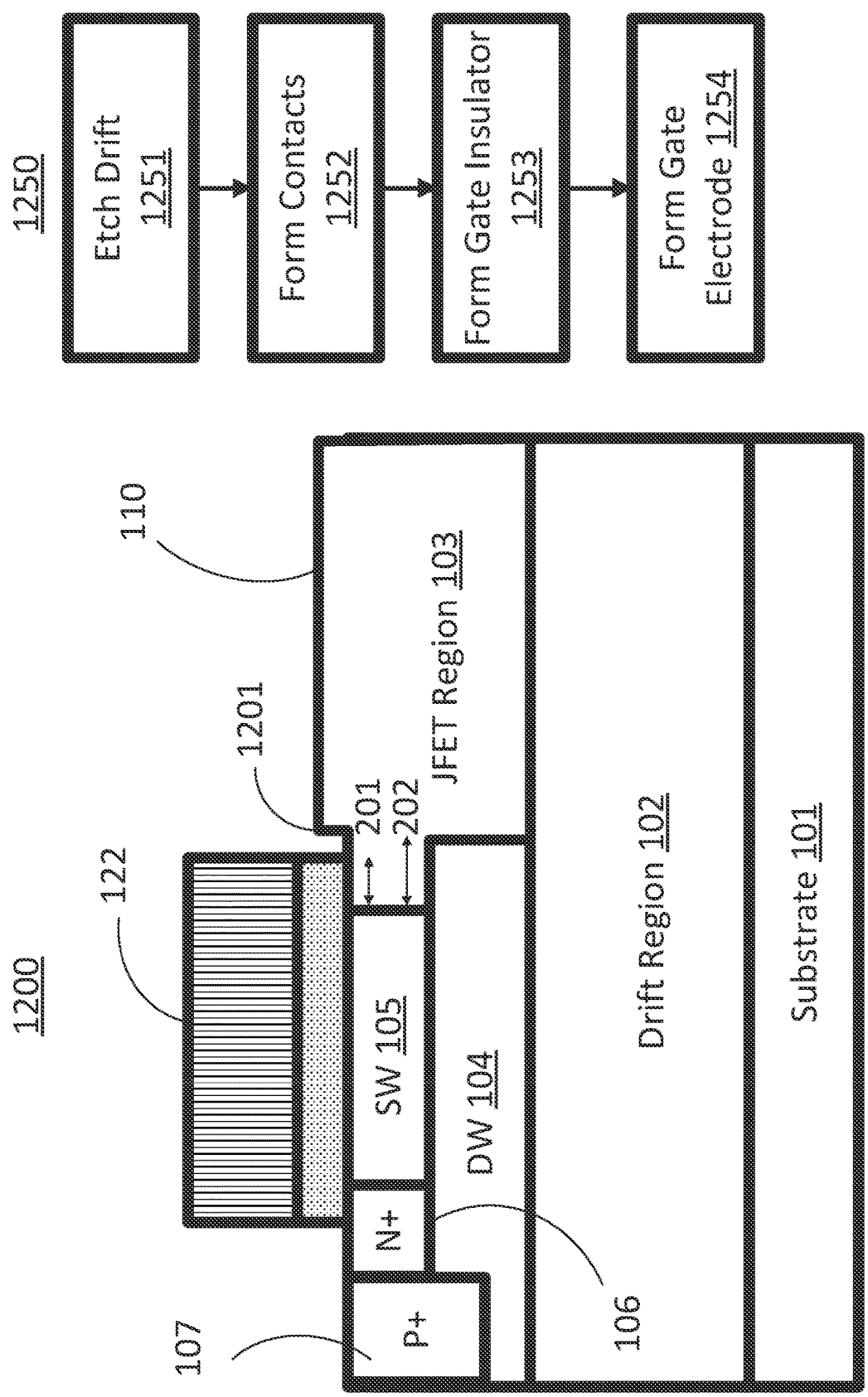
FIG. 12 illustrates the formation of an alignment depression in accordance with specific embodiments of the invention disclosed herein.

FIG. 12 illustrates a flow chart 1250 and a cross section 1200 that can be used to describe a potential alignment method for aligning features to the deep well region of specific embodiments of the devices disclosed herein. Flow chart 1250 begins with step 1251. Step 1251 involves etching the drift region over the deep well region to form an alignment depression. This step can be a separate etch conducted using the mask used to form the deep well (e.g., mask 404) by over etching into the drift region. Alternatively, this step can be a continuation of the etching that forms the mask for the deep well implant (e.g., mask 404). Alternatively, this step can involve over etching into an etch stop layer on the surface of the drift region. Such an approach may be beneficial where the etching is done using a plasma etch that should not be applied to a surface of the drift region on which gate insulator will be deposited or grown.

Flow chart 1250 also includes a step 1251 of forming a source contact region. Step 1252 can be conducted in the same manner as step the corresponding sub-step in step 313 described above except that the mask used for the source contact region implant can be aligned to the deep well region (and therefore the shallow well region) using the alignment depression. Flow chart 1250 also include step 1253 of forming a gate insulator over the deep well region and the shallow well region. Step 1253 can be conducted in the same manner as step 314 described above. Flow chart 1250 also includes a step 1254 of forming a gate electrode, over the gate insulator, using a mask aligned to the deep well region. Step 1254 can be conducted in the same manner as step 315 described above except the third mask is aligned to the deep well region using the alignment depression. An example alignment depression 1201 is shown in cross section 1200.

While the specification has been described in detail with respect to specific embodiments of the invention, it will be appreciated that those skilled in the art, upon attaining an understanding of the foregoing, may readily conceive of alterations to, variations of, and equivalents to these embodiments. For example, although the example of a high-power transistor was used throughout this disclosure, specific embodiments disclosed herein are more broadly applicable to any FET. Furthermore, although silicon carbide and silicon semiconductor materials were provided by way of example, specific embodiments disclosed herein are broadly applicable to any form of semiconductor technology including any III-V semiconductor material and other compound semiconductor material. These and other modifications and variations to the present invention may be practiced by those skilled in the art, without departing from the scope of the present invention, which is more particularly set forth in the appended claims.

What is claimed is:

1. A process, for forming a field effect transistor, comprising:
   forming a first mask;
   implanting a deep well region in a drift region using the first mask;
   forming a spacer in contact with the first mask;
   implanting a shallow well region in the drift region using the first mask and the spacer;
   forming a second mask using the first mask and the spacer; and
   implanting a junction field effect region in the drift region using the second mask;
   whereby:
      the junction field effect region: (i) is contact with the shallow well region,
      the drift region, and the deep well region; and (ii) has a junction field effect doping concentration;
      a portion of the junction field effect region is located above the deep well region; and
      the portion of the junction field effect region is fully depleted by the deep well region when the field effect transistor is off.

2. The process of claim 1, whereby:
   the portion of the junction field effect region, as influenced by the deep well region, and the shallow well region form a hybrid channel for the field effect transistor.

3. A process, for forming a field effect transistor, comprising:
   forming a first mask;
   implanting a deep well region in a drift region using the first mask;
   forming a spacer in contact with the first mask;
   implanting a shallow well region in the drift region using the first mask and the spacer;
   forming a second mask over a junction field effect region and the shallow well region;
   implanting a source contact region in the shallow well region using the second mask;
   forming a third mask over the junction field effect region and the source contact region; and
   implanting a deep well contact in the shallow well region using the third mask.

4. A process, for forming a field effect transistor, comprising:
   forming a first mask;
   implanting a deep well region in a drift region using the first mask;
   forming a spacer in contact with the first mask;
   implanting a shallow well region in the drift region using the first mask and the spacer;
   forming a second mask using the first mask and the spacer; and
   implanting a junction field effect region in the drift region using the second mask;
   wherein: (i) the second mask is a photoresist mask; and (ii) the first mask is a hard mask.

5. The process of claim 4, further comprising:
   etching away the first mask after forming the second mask and prior to implanting the junction field effect region in the drift region.

6. A process, for forming a field effect transistor, comprising:
   forming a first mask;
   implanting a deep well region in a drift region using the first mask;
   forming a spacer in contact with the first mask;
   implanting a shallow well region in the drift region using the first mask and the spacer;
   forming a second mask using the first mask and the spacer;
   implanting a junction field effect region in the drift region using the second mask;
   forming a gate insulator over the deep well region and the shallow well region;
   forming, in alignment with the deep well region, a third mask; and
   forming a gate electrode, over the gate insulator, using the third mask.

7. The process of claim 6, whereby:
   in a single cross section of the field effect transistor, the gate electrode extends past the lateral extent of the shallow well region in a first direction and does not extend past a lateral extent of the deep well region in the first direction.

8. The process of claim 7, whereby:
   the field effect transistor is radiation tolerant by the deep well region shielding the gate electrode; and
   the field effect transistor operates effectively in a radiation field with a linear energy transfer of greater than 10 MeV/(mg/cm$^2$).

9. A process, for forming a field effect transistor, comprising:
   forming a first mask;
   implanting a deep well region in a drift region using the first mask;
   forming a spacer in contact with the first mask;
   implanting a shallow well region in the drift region using the first mask and the spacer;
   forming a second mask using the first mask and the spacer;
   implanting a junction field effect region in the drift region using the second mask;
   forming a second spacer in contact with the spacer; and
   implanting a source contact region in the shallow well region using the second spacer, the spacer, and the first mask.

10. The process of claim 9, wherein:
   the field effect transistor is formed on a substrate; and
   the second spacer has a width, measured across a surface of the substrate, of greater than 0.2 microns and less than 1 micron.

11. A process, for forming a field effect transistor, comprising:
   forming a first mask;
   implanting a deep well region in a drift region using the first mask;
   forming a spacer in contact with the first mask;
   forming a gate insulator over the deep well region and a shallow well region;
   forming, in alignment with the deep well region, a second mask;
   forming a gate electrode, over the gate insulator, using the second mask; and
   implanting a shallow well region in the drift region using the first mask and the spacer.

12. The process of claim 11, whereby:
   in a single cross section of the field effect transistor, the gate electrode extends past the lateral extent of the shallow well region in a first direction and does not extend past a lateral extent of the deep well region in the first direction.

13. The process of claim 11, whereby:
the field effect transistor is radiation tolerant by the deep well region shielding the gate electrode; and
the field effect transistor operates effectively in a radiation field with a linear energy transfer of greater than 10 MeV/(mg/cm$^2$).

14. The process of claim 3, further comprising:
forming a fourth mask using the first mask and the spacer; and
implanting a junction field effect region in the drift region using the fourth mask.

15. A process, for forming a field effect transistor, comprising:
forming a first mask;
implanting a deep well region in a drift region using the first mask;
forming a spacer in contact with the first mask;
implanting a shallow well region in the drift region using the first mask and the spacer;
forming a second spacer in contact with the spacer; and
implanting a source contact region in the shallow well region using the second spacer, the spacer, and the first mask.

16. The process of claim 15, wherein:
the field effect transistor is formed on a substrate; and
the second spacer has a width, measured across a surface of the substrate, of greater than 0.2 microns and less than 1 micron.

* * * * *